(12) United States Patent
Facchetti et al.

(10) Patent No.: US 7,892,454 B2
(45) Date of Patent: Feb. 22, 2011

(54) ACENE-BASED ORGANIC SEMICONDUCTOR MATERIALS AND METHODS OF PREPARING AND USING THE SAME

(75) Inventors: Antonio Facchetti, Chicago, IL (US); Tobin J. Marks, Evanston, IL (US); Zhiming M. Wang, Evanston, IL (US)

(73) Assignees: Polyera Corporation, Skokie, IL (US); Northwestern University, Evanston, IL (US)

( * ) Notice: Subject to any disclaimer, the term of this patent is extended or adjusted under 35 U.S.C. 154(b) by 531 days.

(21) Appl. No.: 11/986,017

(22) Filed: Nov. 19, 2007

(65) Prior Publication Data

US 2008/0185555 A1    Aug. 7, 2008

Related U.S. Application Data

(60) Provisional application No. 60/859,641, filed on Nov. 17, 2006.

(51) Int. Cl.
*H01B 1/00* (2006.01)
*H01L 29/08* (2006.01)
*C09B 5/00* (2006.01)

(52) U.S. Cl. .......................... 252/500; 257/40; 548/418
(58) Field of Classification Search ................. 252/500; 257/40; 548/418
See application file for complete search history.

(56) References Cited

U.S. PATENT DOCUMENTS

| | | | |
|---|---|---|---|
| 2,628,963 A | 2/1953 | Laucius et al. | |
| 4,356,102 A | 10/1982 | Aftergut et al. | |
| 4,466,899 A | 8/1984 | Ditter et al. | |
| 4,611,385 A * | 9/1986 | Forrest et al. | 438/16 |
| 6,063,181 A | 5/2000 | Bohm et al. | 106/493 |
| 6,143,905 A | 11/2000 | Bohm et al. | 549/232 |
| 6,184,378 B1 | 2/2001 | Bohm et al. | 546/37 |
| 6,252,245 B1 | 6/2001 | Katz et al. | 257/40 |
| 6,326,494 B1 | 12/2001 | Bohm et al. | 546/37 |
| 6,358,633 B1 | 3/2002 | Sano et al. | |
| 6,541,300 B1 * | 4/2003 | Chowdhuri et al. | 438/99 |
| 6,551,717 B2 * | 4/2003 | Katz et al. | 428/447 |
| 6,690,029 B1 | 2/2004 | Anthony et al. | |
| 6,768,132 B2 | 7/2004 | Smith et al. | |
| 6,806,368 B2 | 10/2004 | Wurthner et al. | 546/37 |

(Continued)

FOREIGN PATENT DOCUMENTS

CA    2569364    12/2005

(Continued)

OTHER PUBLICATIONS

Ahrens et al., "Cyanated Perylene-3,4-dicarboximides and Perylene-3,4:9,10-bis(dicarboximide):Facile Chromophoric Oxidants for Organic Photonics and Electronics," *Chem. Mater.*, 15:2684-2686 (2003).

(Continued)

*Primary Examiner*—Mark Kopec
*Assistant Examiner*—Jaison P Thomas
(74) *Attorney, Agent, or Firm*—K&L Gates LLP

(57) ABSTRACT

Acene-based compounds that can be used to prepare n-type semiconductor materials are provided with processes for preparing the same. Composites and electronic devices including n-type semiconductor materials prepared from these compounds also are provided.

10 Claims, 10 Drawing Sheets

U.S. PATENT DOCUMENTS

| | | | |
|---|---|---|---|
| 6,963,080 B2 | 11/2005 | Afzali-Ardakani et al. | |
| 7,061,010 B2 | 6/2006 | Minakata | |
| 7,422,777 B2* | 9/2008 | Shukla et al. | 428/1.1 |
| 2003/0219625 A1 | 11/2003 | Wolk et al. | 428/690 |
| 2004/0023061 A1 | 2/2004 | Kathirgamanathan et al. | 428/690 |
| 2005/0176970 A1 | 8/2005 | Marks et al. | 549/41 |
| 2005/0274945 A1* | 12/2005 | Fallis et al. | 257/40 |
| 2006/0273311 A1* | 12/2006 | Ohe et al. | 257/40 |
| 2007/0137520 A1 | 6/2007 | Brown et al. | |
| 2008/0021220 A1 | 1/2008 | Marks et al. | 546/68 |
| 2008/0167435 A1 | 7/2008 | Marks et al. | |
| 2008/0177073 A1 | 7/2008 | Facchetti et al. | |
| 2008/0185577 A1 | 8/2008 | Facchetti et al. | |
| 2008/0242870 A1* | 10/2008 | Meador et al. | 548/417 |
| 2008/0249309 A1 | 10/2008 | Facchetti et al. | |
| 2008/0264487 A1* | 10/2008 | Takahashi et al. | 136/263 |

FOREIGN PATENT DOCUMENTS

| | | |
|---|---|---|
| CN | 1990488 A | 7/2007 |
| JP | 2003327857 A * | 11/2003 |
| WO | 2006/037539 | 4/2006 |
| WO | 2006/050860 | 5/2006 |
| WO | 2006/115714 | 11/2006 |
| WO | 2008/128618 | 10/2008 |

OTHER PUBLICATIONS

Désilets et al., "Design and synthesis of near-infrared absorbing pigments. I. Use of Pariser-Parr-Pople molecular orbital calculations for the identification of near-infrared absorbing pigment candidates," *Can. J. Chem.*, 73:319-324 (1995).

Dimitrakopoulos et al., "Organic Thin Film Transistors for Large Area Electronics," *Adv. Mater.*, 14(2):99-117 (2002).

Facchetti et al., "n-Type Building Blocks for Organic Electronics: A Homologous Family of Fluorocarbon-Substituted Thiophene Oligomers with High Carrier Mobility," *Adv. Mater.*, 15(1):33-38 (2003).

Ilhan et al., "Synthesis and Chemosensory Behavior of Anthracene Bisimide Derivatives," *Chem. Mater.*, 16:2978-2980 (2004).

Jones et al., "High-Mobility Air-Stable n-Type Semiconductors with Processing Versatility: Dicyanoperylene-3,4:9,10-bis(dicarboximides)," *Angew., Chem. Int. Ed.*, 43:6363-6366 (2004).

Katz et al., "Naphthalenetetracarboxylic Diimide-Based n-Channel Transistor Semiconductors: Structural Variation and Thiol-Enhanced Gold Contacts," *J. Am. Chem. Soc.*, 122:7787-7792 (2000).

Malenfant et al., "N-type organic thin-film transistor with high field-effect mobility based on a N,N'-dialky1-3,4,9,10-perylene tetracarboxylic diimide derivative," *Applied Physics Letters*, 80(14):2517-2519 (2002).

Morris et al., "Synthesis of Extended Linear Aromatics Using Tandem Diels-Alder Aromatization Reactions," *J. Org. Chem.*, 59:6484-6486 (1994).

Mushrush et al., "Easily Processable Phenylene-Thiophene-Based Organic Field-Effect Transistors and Solution-Fabricated Nonvolatile Transistor Memory Elements," *J. Am. Chem. Soc.*, 125:9414-9423 (2003).

* cited by examiner

ACENE-BASED ORGANIC SEMICONDUCTOR MATERIALS AND METHODS OF PREPARING AND USING THE SAME

CROSS REFERENCE TO RELATED APPLICATION

This application claims priority to and the benefit of U.S. Provisional Patent Application Ser. No. 60/859,641, filed on Nov. 17, 2006, the disclosure of which is incorporated by reference in its entirety.

STATEMENT REGARDING FEDERALLY SPONSORED RESEARCH OR DEVELOPMENT

The. United States government has certain rights to the invention(s) pursuant to Grant Nos. N00014-02-1-0909, DMR0076097, and NCC2-1363 from the Office of Naval Research, the National Science Foundation, and the National Aeronautics and Space Administration, respectively, all to Northwestern University.

BACKGROUND

Electronic devices based on "plastic" components such as organic thin film transistors (TFT), organic light emitting diodes (OLEDs), printable circuits, organic photovoltaic devices, capacitors, and sensors have received much attention in the past few years. Similar to inorganic material-based electronics, organic-based devices can operate efficiently and at high speed if both p-type (where the majority charge carriers are holes) and n-type (where the majority charge carriers are electrons) semiconductor materials exhibit high carrier mobility and stability over time under ambient conditions and can be processed in a cost-effective manner. The electronic structure of most organic semiconductors consists of delocalized $\pi$ orbitals within a molecular/polymeric a framework that mainly constitutes $sp^2$ hybridized carbon atoms and to some extent, heteroatoms such as sulfur, nitrogen, and oxygen.

To date, optimized organic materials are mainly p-type semiconductors. In contrast, n-type organic semiconducting materials are limited to a handful of small molecules and polymers. Among the limited number of n-type semiconductors, most suffer from drawbacks including poor stability in air and poor solubility in common organic solvents, which limit the type of manufacturing process (e.g., printing deposition) that can be used with these n-type semiconducting compounds.

Accordingly, there is a desire in the art for new air-stable and solution-processible n-type organic semiconductor materials that can be integrated in various device designs including, but not limited to, complementary circuits, organic light emitting diodes (OLEDs), organic photovoltaics, capacitors, and sensors.

SUMMARY

In light of the foregoing, the present teachings provide organic semiconductor compounds and materials, and related devices that can address various deficiencies and shortcomings of the prior art, including those outlined above.

More specifically, the present teachings provide organic semiconductor compounds and materials that are based upon compounds having a polycyclic aromatic core functionalized with

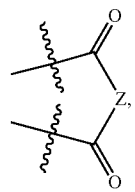

where Z is as defined herein.

In some embodiments, the polycyclic aromatic core can have formula (I) or formula (II):

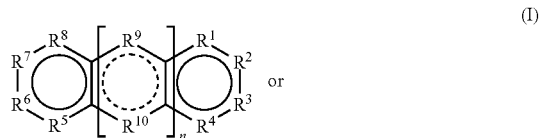

(I)

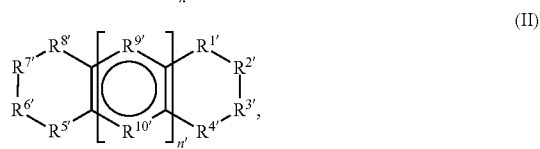

(II)

where $R^1$, $R^2$, $R^3$, $R^4$, $R^5$, $R^6$, $R^7$, $R^8$, $R^9$, $R^{10}$, $R^{1'}$, $R^{2'}$, $R^{3'}$, $R^{4'}$, $R^{5'}$, $R^{6'}$, $R^{7'}$, $R^{8'}$, $R^{9'}$, $R^{10'}$, n, and n' are as defined herein.

The present teachings also provide various compositions, materials, articles of manufacture, structures, and devices that include the compounds disclosed herein.

The foregoing as well as other features and advantages of the present teachings will be more fully understood from the following figures, description, and claims.

BRIEF DESCRIPTION OF THE DRAWINGS

It should be understood that the drawings described below are for illustration purposes only and are not intended to limit the scope of the present teachings in any way.

DETAILED DESCRIPTION

Figure 1:
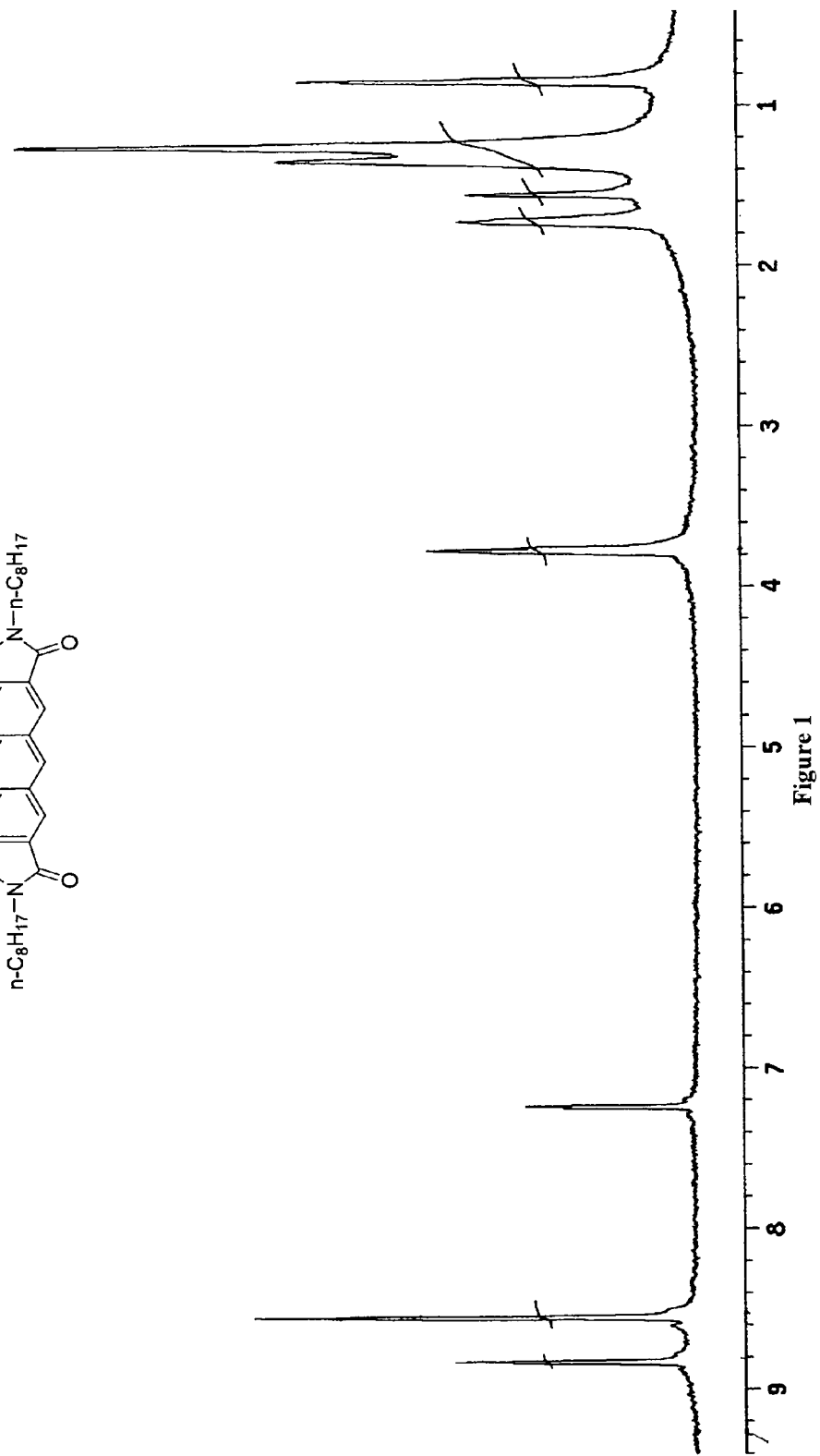
FIG. 1 is a $^1$H NMR spectrum of a compound of the present teachings (ADI8) in deuterated chloroform (CDCl$_3$).

The present teachings relate to organic semiconducting compounds, methods for preparing the same, as well as compositions, materials, articles of manufacture, structures, and devices that include such compounds.

The present teachings provide vapor-deposited and solution-processable, e.g., spin-coatable and printable, organic semiconductor materials (including compounds and compositions) that exhibit useful electrical properties that can be used to fabricate various organic electronic articles of manufacture, structures, and devices. The organic semiconductor materials disclosed herein can be useful as n-type semiconductor materials and can be used, among other applications, to build complementary circuits with a p-type semiconductor that is either inorganic or organic.

More specifically, the present teachings provide N,N'-disubstituted acene bis(dicarboximide)s and related compounds that can be used as n-type semiconductors. These compounds typically have at least some solubility in one or more common solvents and can be stable in ambient conditions. The present teachings also provide compositions, materials, articles of manufacture, structures, and devices that include these compounds.

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

The use of the terms "include," "includes," "including," "have," "has," or "having" should be generally understood as open-ended and non-limiting unless specifically stated otherwise.

In the application, where an element or component is said to be included in and/or selected from a list of recited elements or components, it should be understood that the element or component can be any one of the recited elements or components and can be selected from a group consisting of two or more of the recited elements or components.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value.

It should be understood that the order of steps or order for performing certain actions is immaterial so long as the present teachings remain operable. Moreover, two or more steps or actions may be conducted simultaneously.

As used herein, "dicarboximide" refers to a —C(O)—NH—C(O)— group, where the nitrogen atom can be substituted as disclosed herein.

As used herein, "linear acene" refers to a polycyclic ring system in which two or more 6-membered rings are linearly fused and at least one of the rings is aromatic. Examples of linear acenes include, but are not limited to, naphthalene, anthracene, and pentacene.

As used herein, "halo" or "halogen" refers to fluoro, chloro, bromo, and iodo.

As used herein, "alkoxy" refers to —O-alkyl group. An alkoxy group can have 1 to 20 carbon atoms, for example, 1 to 10 carbon atoms (i.e., a $C_{1-10}$ alkoxy group). Examples of alkoxy groups include, but are not limited to, methoxy, ethoxy, propoxy (e.g., n-propoxy and isopropoxy), t-butoxy groups, and the like.

As used herein, "oxo" refers to a double-bonded oxygen (i.e., =O). An oxo derivative of a linear acene refers to a linear acene in which at least one of the rings includes an oxo group.

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl), and the like. In various embodiments, an alkyl group can have 1 to 20 carbon atoms, i.e., a $C_{1-20}$ alkyl group. In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In some embodiments, alkyl groups can be substituted with up to four groups independently selected from $R^g$ and $R^j$ groups, where $R^g$ and $R^j$ are as disclosed herein.

As used herein, "haloalkyl" refers to an alkyl group having one or more halogen substituents. Examples of haloalkyl groups include, but are not limited to, $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula —$C_nX_{2n+1}$ or —$C_nH_{2n+1-t}X_t$, wherein X is F, Cl, Br, or I, n is an integer in the range of 1 to 20, and t is an integer in the range of 0 to 41, provided that t is less than or equal to 2n+1.

As used herein, "alkenyl" refers to a straight-chain or branched alkyl group having one or more carbon-carbon double bonds. Examples of alkenyl groups include, but are not limited to, ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 20 carbon atoms, i.e., a $C_{2-20}$ alkenyl group. In some embodiments, alkenyl groups can be substituted with up to four groups independently selected from $R^g$ and $R^j$ groups, where $R^g$ and $R^j$ are as disclosed herein.

As used herein, "alkynyl" refers to a straight-chain or branched alkyl group having one or more triple carbon-carbon bonds. Examples of alkynyl groups include, but are not limited to, ethynyl, propynyl, butynyl, pentynyl, and the like. The one or more triple carbon-carbon bonds can be internal (such as in 2-butyne) or terminal (such as in 1-butyne). In various embodiments, an alkynyl group can have 2 to 20 carbon atoms, i.e., a $C_{2-20}$ alkynyl group. In some embodiments, alkynyl groups can be substituted with up to four groups independently selected from $R^g$ and $R^j$ groups, where $R^g$ and $R^j$ are as disclosed herein.

As used herein, "cycloalkyl" refers to a non-aromatic carbocyclic group including cyclized alkyl, alkenyl, and alkynyl groups. A cycloalkyl group can be monocyclic (e.g., cyclohexyl) or polycyclic (e.g., containing fused, bridged, and/or spiro ring systems), wherein the carbon atoms are located inside or outside of the ring system. Any suitable ring position of the cycloalkyl group can be covalently linked to the defined chemical structure. Examples of cycloalkyl groups include, but are not limited to, cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In various embodiments, a cycloalkyl group can have 3 to 14 carbon atoms, including 3 to 10 carbon atoms (i.e., a $C_{3-10}$ cycloalkyl group). In some embodiments, cycloalkyl groups can be substituted with up to four groups independently selected from $R^g$ and $R^j$ groups, where $R^g$ and $R^j$ are as disclosed herein.

As used herein, "heteroatom" refers to an atom of any element other than carbon or hydrogen and includes, for example, nitrogen, oxygen, sulfur, phosphorus, and selenium.

As used herein, "cycloheteroalkyl" refers to a non-aromatic cycloalkyl group that contains at least one ring heteroatom selected from O, N, and S, and optionally contains one or more double or triple bonds. In various embodiments, a cycloheteroalkyl group can have 3 to 20 ring atoms, including 3 to 14 ring atoms (i.e., a 3-14 membered cycloheteroalkyl group). One or more N or S atoms in a cycloheteroalkyl ring may be oxidized (e.g., morpholine N-oxide, thiomorpholine S-oxide, thiomorpholine S,S-dioxide). In some embodiments, nitrogen atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted with up to four groups independently selected from $R^g$ and $R^j$ groups, where $R^g$ and $R^j$ are as disclosed herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 14 carbon atoms in its ring system, which can include multiple fused rings. In some embodiments, a polycyclic aryl group can have from 7 to 14 carbon atoms. Any suitable ring position of the aryl group can be covalently linked to the defined chemical structure. Examples of aryl groups having only aromatic carbocyclic ring(s) include, but are not limited to, phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include, but are not limited to, benzodioxanyl, benzodioxolyl, chromanyl, indolinyl groups, and the like. In some embodiments, aryl groups can be substituted with up to four groups independently selected from $R^g$ and $R^j$ groups, where $R^g$ and $R^j$ are as disclosed herein.

As used herein, "heteroaryl" refers to an aromatic monocyclic ring system containing at least 1 ring heteroatom selected from oxygen (O), nitrogen (N), and sulfur (S) or a polycyclic ring system where at least one of the rings present in the ring system is aromatic and contains at least 1 ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, from 5 to 14 ring atoms and contain 1-4 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5-membered monocyclic and 5-6 bicyclic ring systems shown below:

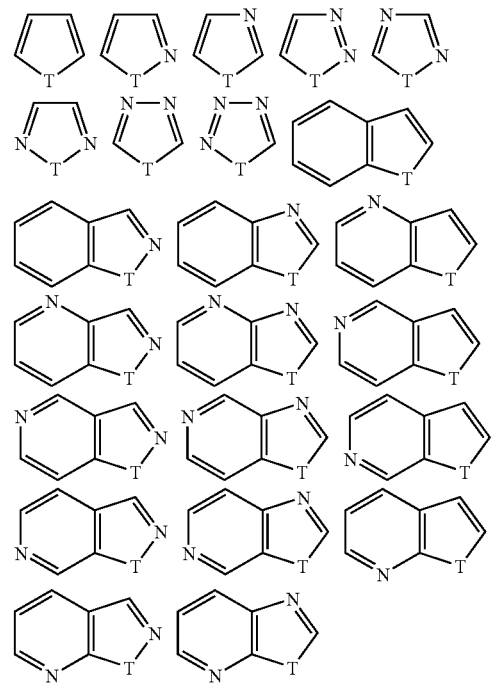

where T is O, S, NH, N-alkyl, N-aryl, or N-(arylalkyl) (e.g., N-benzyl). Examples of heteroaryl groups include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl, and the like. Further examples of heteroaryl groups include, but are not limited to, 4,5,6,7-tetrahydroindolyl, tetrahydroquinolyl, benzothienopyridyl, benzofuropyridyl, and the like. In some embodiments, heteroaryl groups can be substituted with up to four groups independently selected from $R^g$ and $R^j$ groups, where $R^g$ and $R^j$ are as disclosed herein.

As used herein, a "polycyclic aromatic core" refers to a polycyclic ring system containing two or more fused rings in which at least one of the rings is aromatic. Examples of polycyclic aromatic cores include polycyclic aryl groups and polycyclic heteroaryl groups as defined herein. In some embodiments, the polycyclic aromatic core can have three or more fused rings and can have the formulae:

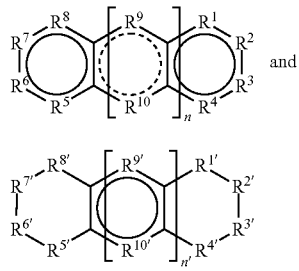

(I)

and (II)

where $R^1$, $R^2$, $R^3$, $R^4$, $R^5$, $R^6$, $R^7$, $R^8$, $R^9$, $R^{10}$, $R^{1'}$, $R^{2'}$, $R^{3'}$, $R^{4'}$, $R^{5'}$, $R^{6'}$, $R^{7'}$, $R^{8'}$, $R^{9'}$, $R^{10'}$, n, and n' are as defined herein. The ring that includes the $R^9$ and $R^{10}$ groups in formula (I) can be aromatic or aliphatic (as represented by the dashed line). Accordingly, when the ring is aromatic, $R^9$ and $R^{10}$ can be independently CH, $CR^g$, SiH, $SiR^g$, N, or P. On the other hand, when the ring is aliphatic, $R^9$ and $R^{10}$ can be independently $CH_2$, $CHR^g$, $C(R^g)_2$, $C(O)$, $C(NR^g)$, $SiH_2$, $SiHR^g$, $Si(R^g)_2$, $N(R^a)$, O, or $S(O)_m$. In some embodiments, the polycyclic aromatic core can be substituted with up to six independently selected $R^g$ groups, where $R^g$ is as disclosed herein.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halide (e.g., Cl, Br, I), tosylate (toluenesulfonyl group, TsO), mesylate (methanesulfonyl group, MsO), brosylate (p-bromobenzenesulfonyl group, BsO), nosylate (4-nitrobenzenesulfonyl group, NsO), water ($H_2O$), ammonia ($NH_3$), and triflate (trifluoromethanesulfonyl group, OTf).

Compounds of the present teachings can include a "divalent group" defined herein as a linking group capable of forming a covalent bond with two other moieties. For example, compounds of the present teachings can include a divalent $C_{1-20}$ alkyl group, such as, for example, a methylene group.

At various places in the present specification, substituents of compounds are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20.

Throughout the specification, structures may or may not be presented with chemical names. Where any question arises as to nomenclature, the structure prevails.

One aspect of the present teachings provides compounds having a polycyclic aromatic core, where the polycyclic aromatic core includes at least three linear fused six-membered rings. Each of the terminal ends of the polycyclic aromatic core can be functionalized with a moiety having the formula:

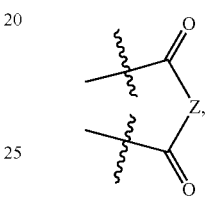

wherein:

Z, at each occurrence, is independently —O—, —S(O)$_r$—, —C(O)—, —N($R^a$)—, —C($R^b$)($R^c$)—, or —C($CR^bR^c$)—;

$R^a$ is a) H, b) —$OR^d$, c) —C(O)$OR^d$, d) —C(O)$R^e$, e) —C(O)NR$^e$R$^f$, f) —C(S)$OR^d$, g) —C(S)$R^e$, h) —C(S)NR$^e$R$^f$, i) —$SR^d$, j) —S(O)$_2$$OR^d$, i) —S(O)$_2$$R^e$, k) —S(O)$_2$NR$^e$R$^f$, j) a $C_{1-20}$ alkyl group, k) a $C_{2-20}$ alkenyl group, l) a $C_{2-20}$ alkynyl group, m) a —Y—$C_{3-10}$ cycloalkyl group, n) a —Y—$C_{6-14}$ aryl group, o) a —Y-3-12 membered cycloheteroalkyl group, or p) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-5 $R^g$ groups;

$R^b$ and $R^c$, at each occurrence, are independently a) H, b) halogen, c) —$(CH_2CH_2O)_p$$CH_3$, d) a $C_{1-20}$ alkyl group, e) a $C_{2-20}$ alkenyl group, f) a $C_{2-20}$ alkynyl group, g) a —Y—$C_{3-10}$ cycloalkyl group, h) a —Y—$C_{6-14}$ aryl group, i) a —Y-3-12 membered cycloheteroalkyl group, or j) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-5 $R^g$ groups;

$R^d$, at each occurrence, is a) H, b) —C(O)$R^e$, c) —C(O)NR$^e$R$^f$, d) —C(S)$R^e$, e) —C(S)NR$^e$R$^f$, f) a $C_{1-20}$ alkyl group, g) a $C_{2-20}$ alkenyl group, h) a $C_{2-20}$ alkynyl group, i) a $C_{3-10}$ cycloalkyl group, j) a $C_{6-14}$ aryl group, k) a 3-12 membered cycloheteroalkyl group, or l) a 5-14 membered heteroaryl group, wherein each of f)-l) optionally is substituted with 1-5 $R^g$ groups;

$R^e$ and $R^f$, at each occurrence, independently are a) H, b) —OH, c) —SH, d) —S(O)$_2$OH, e) —C(O)OH, f) —C(O)NH$_2$, g) —C(S)NH$_2$, h) —O$C_{1-20}$ alkyl, i) —C(O)—$C_{1-20}$ alkyl, j) —C(O)—O$C_{1-20}$ alkyl, k) —C(S)N($C_{1-20}$ alkyl)$_2$, l)

—C(S)NH—$C_{1-20}$ alkyl, m) —C(O)NH—$C_{1-20}$ alkyl, n) —C(O)N($C_{1-20}$ alkyl)$_2$, o) —S(O)$_m$—$C_{1-20}$ alkyl, p) —S(O)$_m$—O$C_{1-20}$ alkyl, q) a $C_{1-20}$ alkyl group, r) a $C_{2-20}$ alkenyl group, s) a $C_{2-20}$ alkynyl group, t) a $C_{1-20}$ alkoxy group, u) a $C_{3-10}$ cycloalkyl group, v) a $C_{6-14}$ aryl group, w) a 3-12 membered cycloheteroalkyl group, or x) a 5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-5 $R^g$ groups;

$R^g$, at each occurrence, independently is a) halogen, b) —CN, c) —NO$_2$, d) oxo, e) —OR$^h$, f) —SR$^h$, g) —NR$^h$R$^i$, h) —N(O)R$^h$R$^i$, i) —S(O)$_m$R$^h$, j) —S(O)$_m$OR$^h$, k) —S(O)$_m$NR$^h$R$^i$, l) —C(O)R$^h$, m) —C(O)OR$^h$, n) —C(O)NR$^h$R$^i$, o) —C(S)NR$^h$R$^i$, p) SiH$_3$, q) SiH($C_{1-20}$ alkyl)$_2$, r) SiH$_2$($C_{1-20}$ alkyl), s) Si($C_{1-20}$ alkyl)$_3$, t) a $C_{1-20}$ alkyl group, u) a $C_{2-20}$ alkenyl group, v) a $C_{2-20}$ alkynyl group, w) a —Y—$C_{3-10}$ cycloalkyl group, x) a —Y—$C_{6-14}$ aryl group, y) a —Y-3-12 membered cycloheteroalkyl group, or z) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-5 $R^j$ groups;

$R^h$ and $R^i$, at each occurrence, independently are a) H, b) —S(O)$_2$OH, c) —C(O)OH, d) —C(O)NH$_2$, e) —C(S)NH$_2$, f) —C(O)—$C_{1-20}$ alkyl, g) —C(O)—O$C_{1-20}$ alkyl, h) —C(S)N($C_{1-20}$ alkyl)$_2$, i) —C(S)NH—$C_{1-20}$ alkyl, j) —C(O)NH—$C_{1-20}$ alkyl, k) —C(O)N($C_{1-20}$ alkyl)$_2$, l) —S(O)$_m$—$C_{1-20}$ alkyl, m) —S(O)$_m$—O$C_{1-20}$ alkyl, n) —C(O)—$C_{6-14}$ aryl, o) —C(O)—O$C_{6-14}$ aryl, p) —C(S)N($C_{6-14}$ aryl)$_2$, q) —C(S)N($C_{1-20}$ alkyl)-$C_{6-14}$ aryl, r) —C(S)NH—$C_{6-14}$ aryl, s) —C(O)NH—$C_{6-14}$ aryl, t) —C(O)N($C_{1-20}$ alkyl)-$C_{6-14}$ aryl, u) —C(O)N($C_{6-14}$ aryl)$_2$, v) —S(O)$_m$—$C_{6-14}$ aryl, w) —S(O)$_m$—O$C_{6-14}$ aryl, x) a $C_{1-20}$ alkyl group, y) a $C_{2-20}$ alkenyl group, z) a $C_{2-20}$ alkynyl group, aa) a $C_{1-20}$ alkoxy group, ab) a $C_{3-10}$ cycloalkyl group, ac) a $C_{6-14}$ aryl group, ad) a 3-12 membered cycloheteroalkyl group, or ae) a 5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-5 $R^j$ groups;

$R^j$, at each occurrence, independently is a) halogen, b) —CN, c) —NO$_2$, d) oxo, e) —OH, f) —NH$_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_m$H, l) —S(O)$_m$—$C_{1-20}$ alkyl, m) —S(O)$_2$OH, n) —S(O)$_m$—O$C_{1-20}$ alkyl, o) —S(O)$_m$—O$C_{6-14}$ aryl, p) —CHO, q) —C(O)—$C_{1-20}$ alkyl, r) —C(O)—$C_{6-14}$ aryl, s) —C(O)OH, t) —C(O)O$C_{1-20}$ alkyl, u) —C(O)—O$C_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)$C_{6-14}$ aryl, ag) —C(S)NH—$C_{6-14}$ aryl, ah) —S(O)$_m$NH$_2$, ai) —S(O)$_m$NH($C_{1-20}$ alkyl), aj) —S(O)$_m$N($C_{1-20}$ alkyl)$_2$, ak) —S(O)$_m$NH($C_{6-14}$ aryl), al) —S(O)$_m$N($C_{1-20}$ alkyl)-$C_{6-14}$ aryl, am) —S(O)$_m$N($C_{6-14}$ aryl)$_2$, an) SiH$_3$, ao) SiH($C_{1-20}$ alkyl)$_2$, ap) SiH$_2$($C_{1-20}$ alkyl), ar) —Si($C_{1-20}$ alkyl)$_3$, as) a $C_{1-20}$ alkyl group, at) a $C_{2-20}$ alkenyl group, au) a $C_{2-20}$ alkynyl group, av) a $C_{1-20}$ alkoxy group, aw) a $C_{1-20}$ alkylthio group, ax) a $C_{1-20}$ haloalkyl group, ay) a $C_{3-20}$ cycloalkyl group, az) a $C_{6-14}$ aryl group, ba) a 3-12 membered cycloheteroalkyl group, or bb) a 5-14 membered heteroaryl group; Y, at each occurrence, is independently a divalent $C_{1-20}$ alkyl group, a divalent $C_{1-20}$ haloalkyl group, or a covalent bond;

m is 0, 1, or 2;

p is an integer in the range of 1-20;

and the polycyclic aromatic core is optionally substituted with 1-6 $R^g$ groups, where $R^g$ is as defined herein.

In some embodiments, the semiconducting compound of the present teachings can have a polycyclic aromatic core of formula (I):

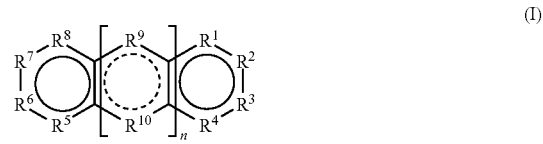

(I)

wherein:

$R^1$, $R^4$, $R^5$, and $R^8$ are independently CH, CR$^g$, SiH, SiR$^g$, N, or P;

each of $R^2$ and $R^3$ is a carbon atom and $R^2$ and $R^3$ taken together with the moiety having the formula —C(O)-Z-C(O)— form a 5-membered ring;

each of $R^6$ and $R^7$ is a carbon atom and $R^6$ and $R^7$ taken together with the moiety having the formula —C(O)-Z-C(O)— form a 5-membered ring;

$R^9$ and $R^{10}$, at each occurrence, are independently CH, CR$^g$, CH$_2$, CHR$^g$, C(R$^g$)$_2$, C(=NR$^g$), SiH, SiR$^g$, SiH$_2$, SiHR$^g$, Si(R$^g$)$_2$, N,N(R$^a$), O, S(O)$_m$, or P;

n is 1, 2, 3, 4, or 5; and $R^g$ and m are as defined herein.

For example, in some embodiments, each of $R^1$, $R^4$, $R^5$, and $R^8$ can be CH. In some embodiments, $R^9$ and $R^{10}$, at each occurrence, can be independently CH, C(CN), C(Br), C(CF$_3$), or N. In certain embodiments, $R^9$ and $R^{10}$, at each occurrence, can be independently CH$_2$, C(O), C(Br)$_2$, or NH.

In other embodiments, the semiconducting compound of the present teachings can have a polycyclic aromatic core of formula (II):

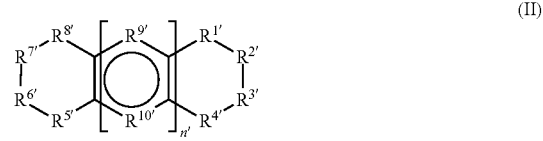

(II)

wherein:

$R^{1'}$, $R^{4'}$, $R^{5'}$, and $R^{8'}$ are independently CH$_2$, CHR$^g$, C(O), C(R$^g$)$_2$, C(NR$^g$), SiH$_2$, SiHR$^g$, Si(R$^g$)$_2$, N(R$^a$), O, or S(O)$_m$;

each of $R^{2'}$ and $R^{3'}$ is a carbon atom and $R^{2'}$ and $R^{3'}$ taken together with the moiety having the formula —C(O)-Z-C(O)— form a 5-membered ring;

each of $R^{6'}$ and $R^{7'}$ is a carbon atom and $R^{6'}$ and $R^{7'}$ taken together with the moiety having the formula —C(O)-Z-C(O)— form a 5-membered ring;

$R^{9'}$ and $R^{10'}$, at each occurrence, are independently CH, $CR^g$, SiH, $SiR^g$, N, or P;

n is 1, 2, 3, 4, or 5; and $R^g$ and m are as defined herein.

In some embodiments, $R^{1'}$, $R^{4'}$, $R^{5'}$, and $R^{8'}$ can be independently $CH_2$, C(O), $C(Br)_2$, or NH. In some embodiments, $R^{9'}$ and $R^{10'}$, at each occurrence, can be independently CH, C(CN), C(Br), $C(CF_3)$, or N.

In some embodiments, the polycyclic aromatic core can be:

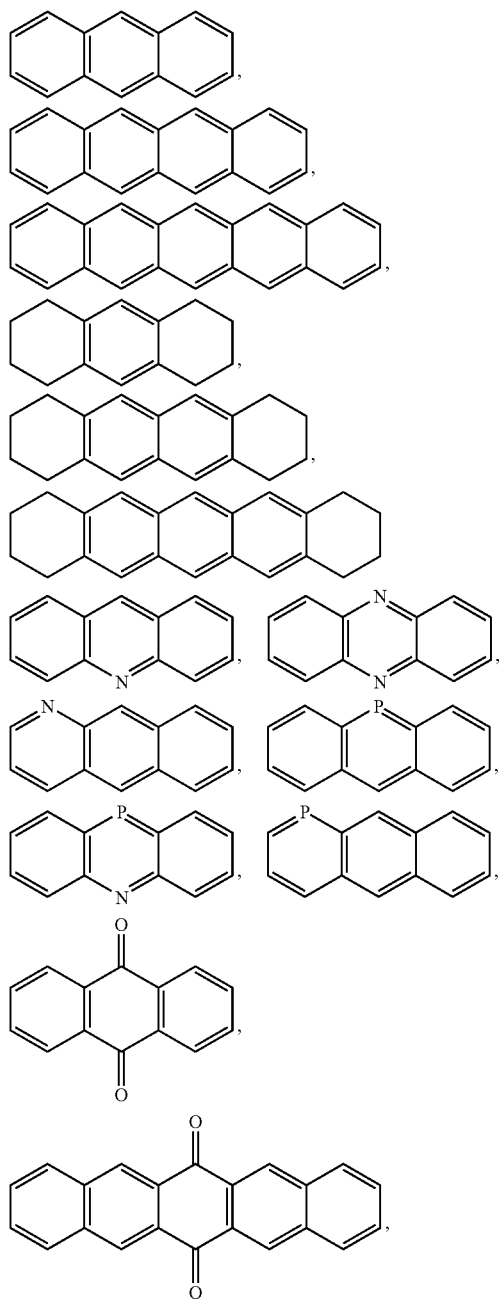

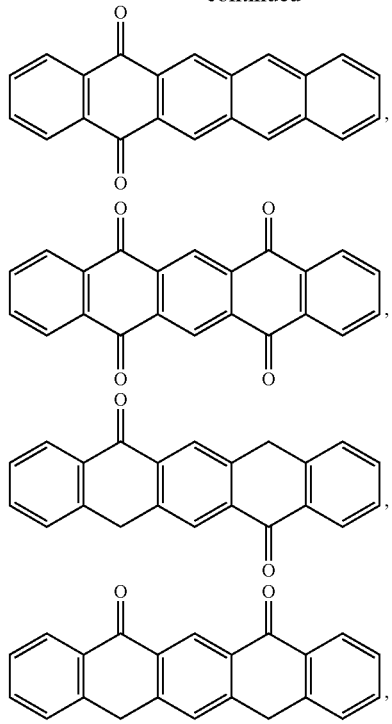

where each of these cores can be optionally substituted with 1-6 $R^1$ groups, and $R^1$ is as defined herein. For example, $R^g$, at each occurrence, can be Br, CN, or $CF_3$.

In certain embodiments, the polycyclic aromatic core can be a linear acene or an oxo derivative thereof each optionally substituted with 1-6 $R^g$ groups, and $R^g$ is as defined herein. In particular embodiments, the polycyclic aromatic core can be anthracene, tetracene, pentacene, hexacene, heptacene, or an oxo derivative thereof, where each of these cores can be optionally substituted with 1-6 $R^g$ groups, and $R^g$ is as defined herein. For example, $R^g$, at each occurrence, can be Br, CN, or $CF_3$.

In certain embodiments, each of the two terminal ends of the polycyclic aromatic cores described above can be functionalized with a dicarboximide group (i.e., a —C(O)—NH—C(O)— group), where the nitrogen atom is substituted with $R^a$, and $R^a$ is as defined herein. For example, each $R^a$ independently can be a $C_{1-10}$ alkyl group, a $C_{2-10}$ alkenyl group, a $C_{2-10}$ alkynyl group, a $C_{1-10}$ haloalkyl group, a $C_{3-10}$ cycloalkyl group, a $C_{6-14}$ aryl group, a 3-12 membered cycloheteroalkyl group, a 5-14 membered heteroaryl group, a —$C_{1-6}$ alkyl-$C_{3-10}$ cycloalkyl group, a —$C_{1-6}$ alkyl-$C_{6-14}$ aryl group, a —$C_{1-6}$ alkyl-3-12 membered cycloheteroalkyl group, or a —$C_{1-6}$ alkyl-5-14 membered heteroaryl group; where each of the $C_{1-10}$ alkyl group, the $C_{2-10}$ alkenyl group, the $C_{2-10}$ alkynyl group, the $C_{3-10}$ cycloalkyl group, the $C_{6-14}$ aryl group, the 3-12 membered cycloheteroalkyl group, and the 5-14 membered heteroaryl group can be optionally substituted with 1-5 $R^g$ groups, and $R^g$ is as defined herein. In some embodiments, each $R^a$ independently can be a straight chain $C_{1-10}$ alkyl group, a branched chain $C_{1-10}$ alkyl group, a straight chain $C_{2-10}$ alkenyl group, a branched chain $C_{2-10}$ alkenyl group, a $C_{6-14}$ aryl group, or a —$C_{1-6}$ alkyl-$C_{6-14}$ aryl group; where each of the straight chain $C_{1-10}$ alkyl group, the branched $C_{1-10}$ alkyl group, the straight chain $C_{2-10}$ alkenyl group, the branched chain $C_{2-10}$ alkenyl group, and the $C_{6-14}$ aryl group can be optionally substituted with 1-5 $R^g$ groups selected from a halogen, —CN, —NO$_2$, a $C_{1-10}$ alkyl group, and a $C_{1-10}$ haloalkyl group. In particular embodiments, each $R^a$ independently can be a $C_{1-10}$ haloalkyl group or a $C_{6-14}$ aryl group optionally substituted with 1-5 halogens.

In some embodiments, the semiconducting compounds of the present teachings can have the formula:

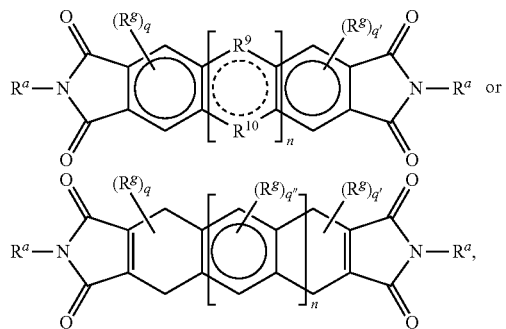

where q, q', and q" are independently 0, 1, or 2; $R^g$, $R^9$, $R^{10}$, and n are as defined herein; and the total number of $R^g$ groups is less than or equal to 6. For example, $R^9$ and $R^{10}$, at each occurrence, can be independently CH, C(CF$_3$), C(O), C(Br), C(CN), CH$_2$, or N. In some embodiments, $R^g$, at each occurrence, can be independently CN, an oxo group, or a halogen including Br or F.

In some embodiments, the nitrogen atoms of the dicarboximide groups can be independently substituted with a $C_{1-10}$ alkyl group, a $C_{2-10}$ alkenyl group, a $C_{2-10}$ alkynyl group, a $C_{1-10}$ haloalkyl group, a $C_{3-10}$ cycloalkyl group, a $C_{6-14}$ aryl group, a 3-12 membered cycloheteroalkyl group, a 5-14 membered heteroaryl group, a —$C_{1-6}$ alkyl-$C_{3-10}$ cycloalkyl group, a —$C_{1-6}$ alkyl-$C_{6-14}$ aryl group, a —$C_{1-6}$ alkyl-3-12 membered cycloheteroalkyl group, or a —$C_{1-6}$ alkyl-5-14 membered heteroaryl group, where each of the $C_{1-10}$ alkyl group, the $C_{2-10}$ alkenyl group, the $C_{2-10}$ alkynyl group, the $C_{3-10}$ cycloalkyl group, the $C_{6-14}$ aryl group, the 3-12 membered cycloheteroalkyl group, and the 5-14 membered heteroaryl group can be optionally substituted with 1-5 $R^g$ groups, and $R^g$ is as defined herein. In particular embodiments, the nitrogen atom of the dicarboximide groups can be independently substituted with a straight chain $C_{1-10}$ alkyl group, a branched chain $C_{1-10}$ alkyl group, a straight chain $C_{2-10}$ alkenyl group, a branched chain $C_{2-10}$ alkenyl group, a $C_{6-14}$ aryl group, or a —$C_{1-6}$ alkyl-$C_{6-14}$ aryl group, where each of the straight chain $C_{1-10}$ alkyl group, the branched $C_{1-10}$ alkyl group, the straight chain $C_{2-10}$ alkenyl group, the branched chain $C_{2-10}$ alkenyl group, and the $C_{6-14}$ aryl group can be optionally substituted with 1-5 $R^g$ groups selected from a halogen, —CN, —NO$_2$, a $C_{1-10}$ alkyl group, and a $C_{1-10}$ haloalkyl group. For example, $R^a$ can be a $C_{1-10}$ haloalkyl group or a $C_{6-14}$ aryl group optionally substituted 1-5 halogen groups.

Although the functional groups substituted on the nitrogen atom of each dicarboximide group can be different, in most embodiments, the two dicarboximide groups are substituted with $R^a$ groups that are the same.

Compounds of the present teachings include, but are not limited to, the compounds presented below:

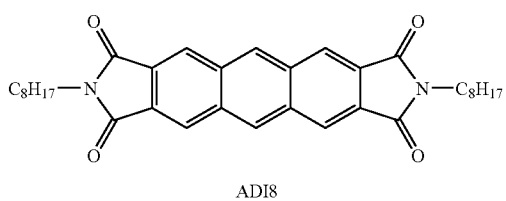

ADI8

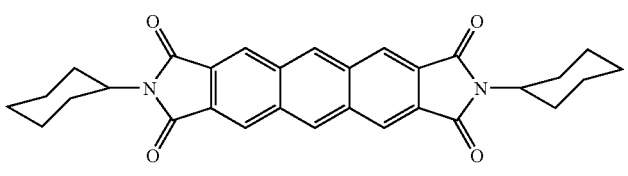

ADICy

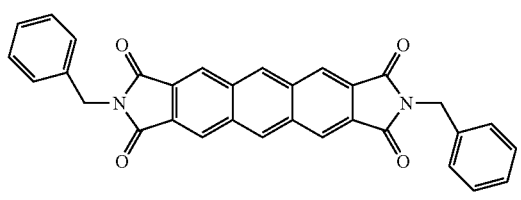

ADI1Ph

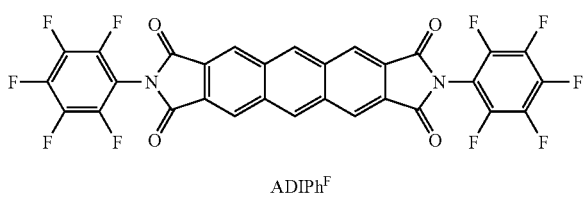

ADIPh$^F$

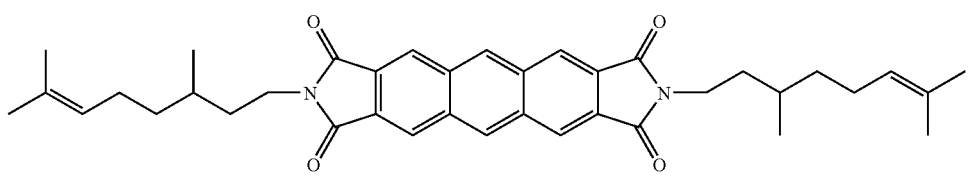

ADICitr

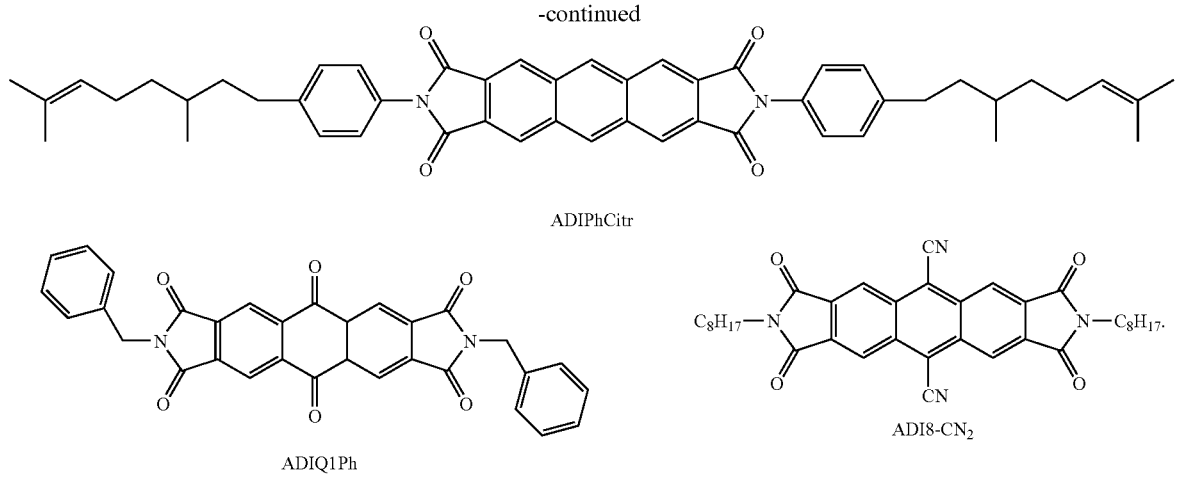

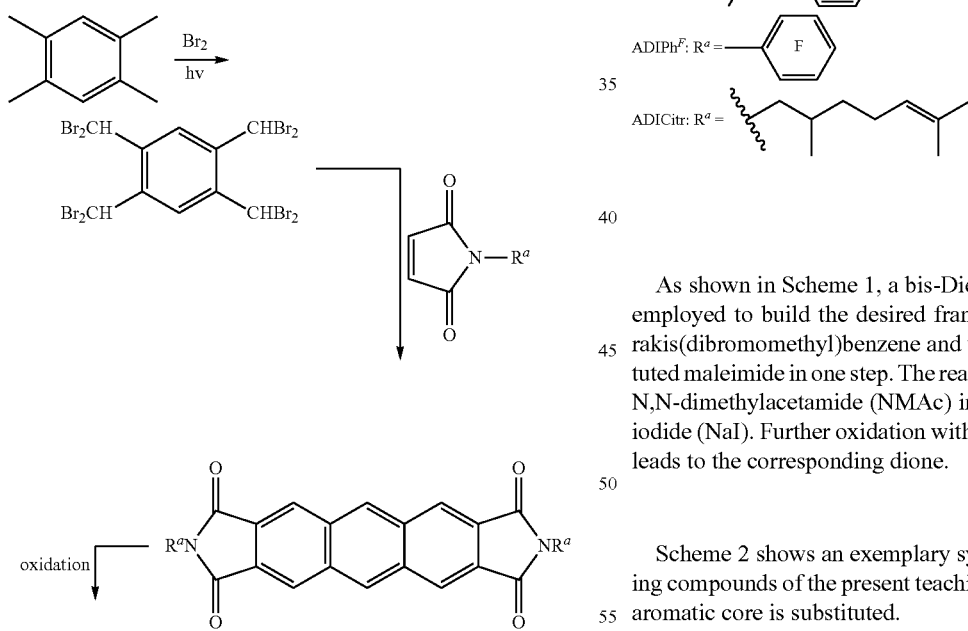

The following schemes depict exemplary synthetic routes that can be used to prepare compounds of the present teachings. These schemes are for illustrative purpose only, and compounds of the present teachings can be prepared by other methods, including those that are known to those skilled artisans.

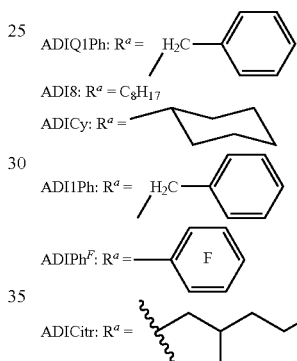

As shown in Scheme 1, a bis-Diels-Alder addition can be employed to build the desired framework from 1,2,4,5-tetrakis(dibromomethyl)benzene and the appropriate N-substituted maleimide in one step. The reaction can be carried out in N,N-dimethylacetamide (NMAc) in the presence of sodium iodide (NaI). Further oxidation with chromium oxide ($CrO_3$) leads to the corresponding dione.

Scheme 2 shows an exemplary synthetic route for preparing compounds of the present teachings where the polycyclic aromatic core is substituted.

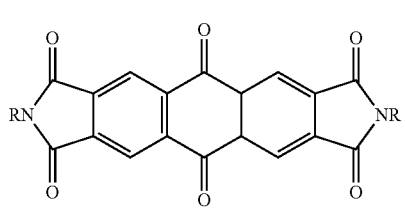

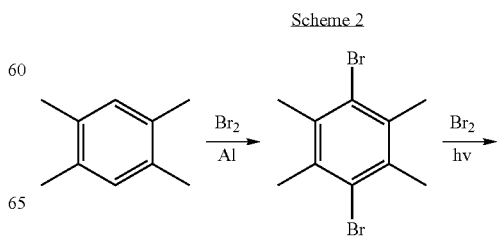

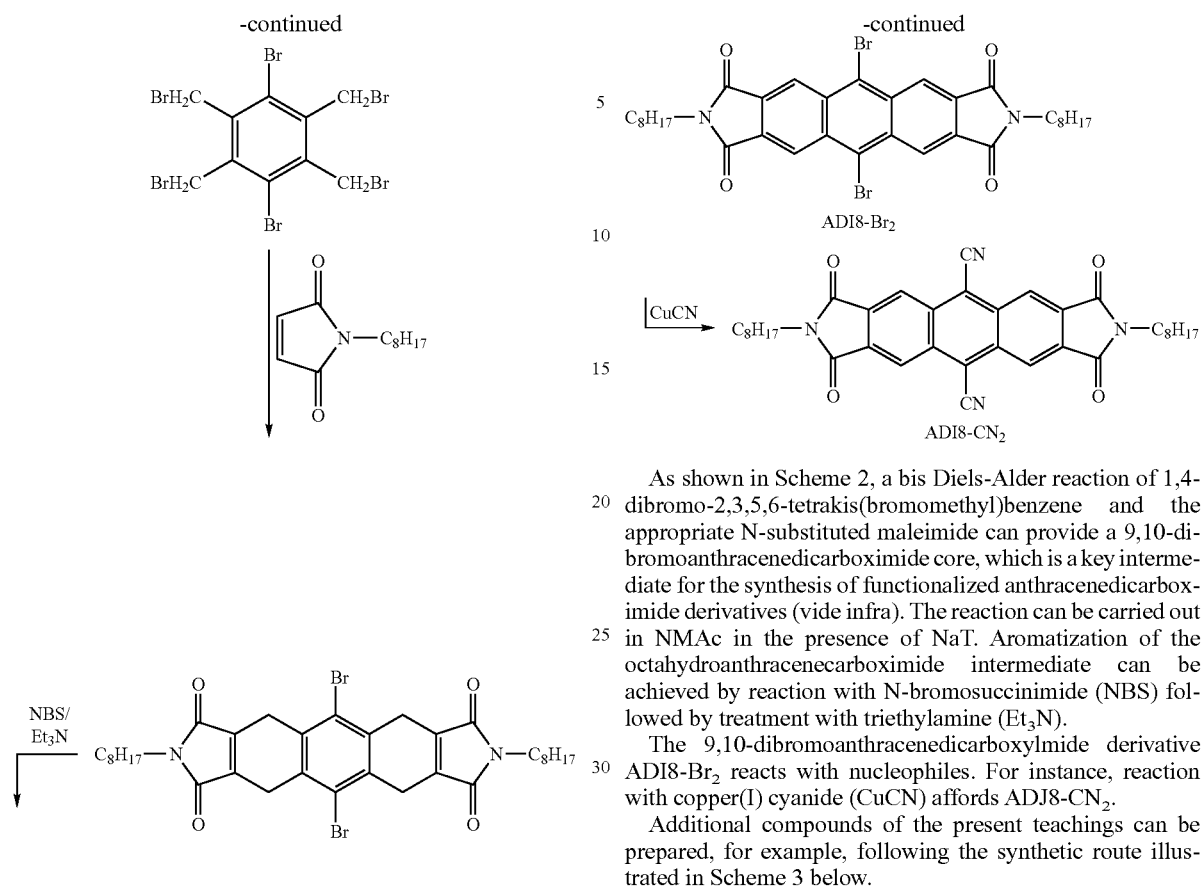

As shown in Scheme 2, a bis Diels-Alder reaction of 1,4-dibromo-2,3,5,6-tetrakis(bromomethyl)benzene and the appropriate N-substituted maleimide can provide a 9,10-dibromoanthracenedicarboximide core, which is a key intermediate for the synthesis of functionalized anthracenedicarboximide derivatives (vide infra). The reaction can be carried out in NMAc in the presence of NaI. Aromatization of the octahydroanthracenecarboximide intermediate can be achieved by reaction with N-bromosuccinimide (NBS) followed by treatment with triethylamine (Et$_3$N).

The 9,10-dibromoanthracenedicarboxylmide derivative ADI8-Br$_2$ reacts with nucleophiles. For instance, reaction with copper(I) cyanide (CuCN) affords ADJ8-CN$_2$.

Additional compounds of the present teachings can be prepared, for example, following the synthetic route illustrated in Scheme 3 below.

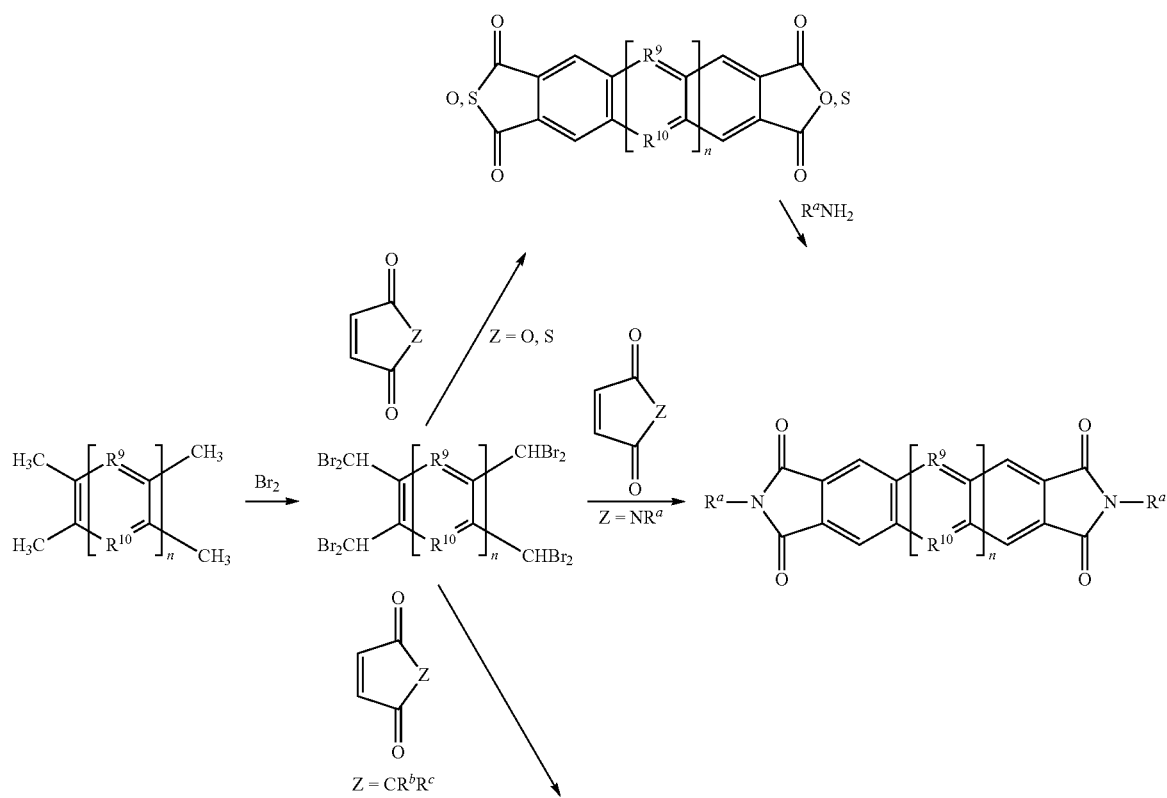

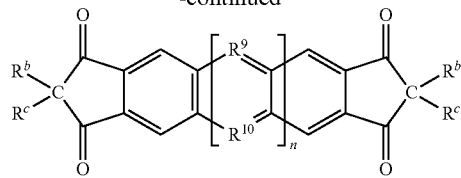

As shown in Scheme 3, in place of the maleimide, anhydrides, thioanhydrides, or appropriately substituted diones can be reacted with the tetrakis(dibromomethyl)benzene moiety to provide various compounds having the polycyclic aromatic core of formula (I), where each of $R^1$, $R^4$, $R^8$, and $R^{10}$ is CH; and each of $R^2$, $R^3$, $R^7$, and $R^8$ is =C—. The anhydrides and thioanhydrides can in turn be reacted with the appropriate N-substituted amines to provide the corresponding carboximides.

Scheme 4 illustrates an exemplary synthetic route for preparing compounds having the polycyclic aromatic core of formula (II), where each of $R^{1'}$, $R^{4'}$, $R^{8'}$, and $R^{10'}$ is $CH_2$; and each of $R^{2'}$, $R^{3'}$, $R^{7'}$, and $R^{8'}$ is =C—.

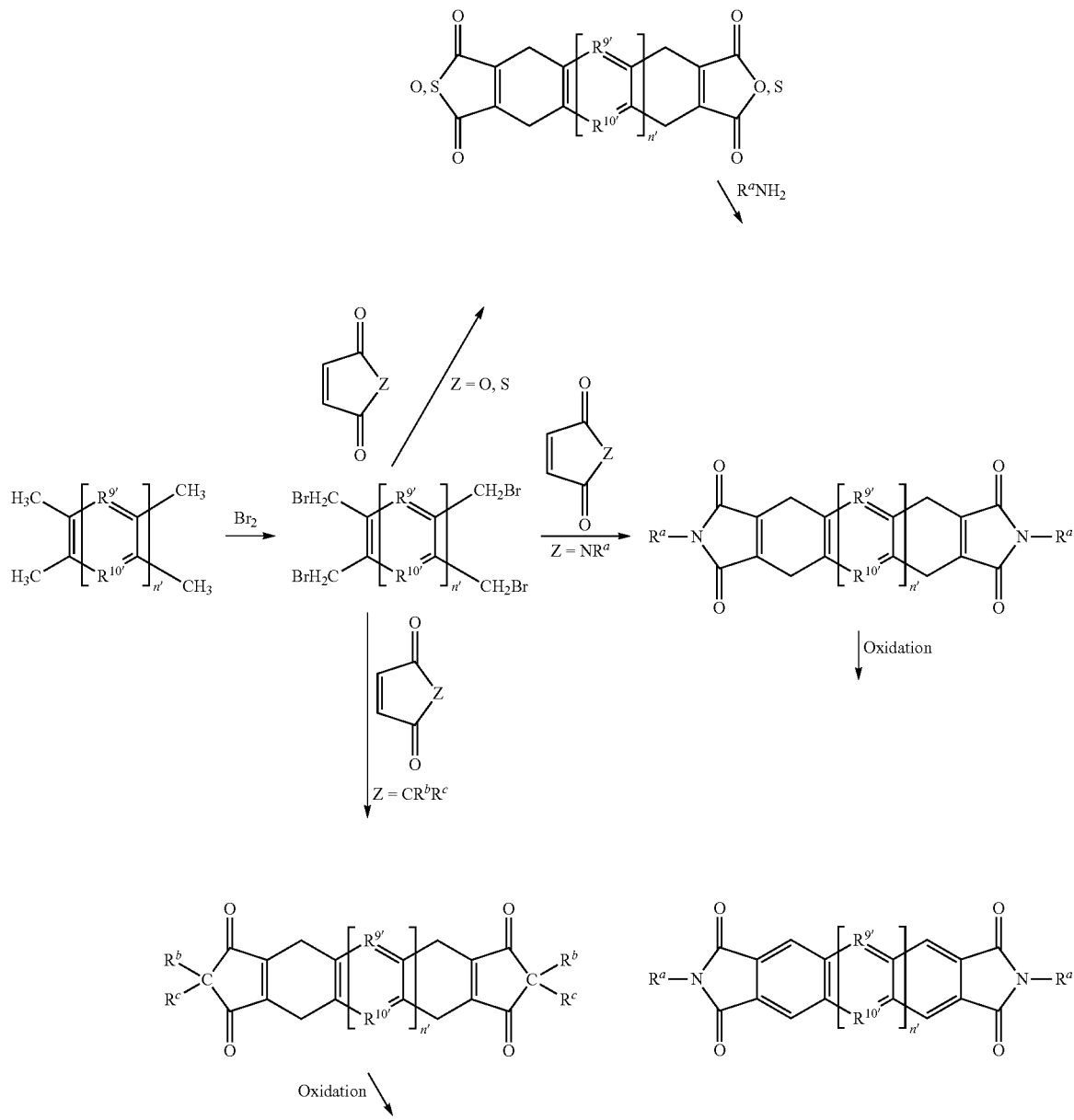

Scheme 4

-continued

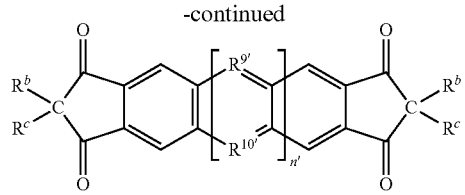

As shown in Scheme 4, anhydrides, thioanhydrides, or appropriately substituted diones or maleimides can be reacted with tetrakis(bromomethyl)benzene to provide compounds having the polycyclic aromatic core of formula (II). The anhydrides and thioanhydrides can in turn be reacted with the appropriate N-substituted amines to provide the corresponding carboximides. Aromatization of the octahydroanthracene core can be achieved by oxidation or reaction with NBS followed by treatment with $Et_3N$ as shown in Scheme 2.

Following the procedures described in Schemes 3 and 4, additional compounds such as those listed below can be made:

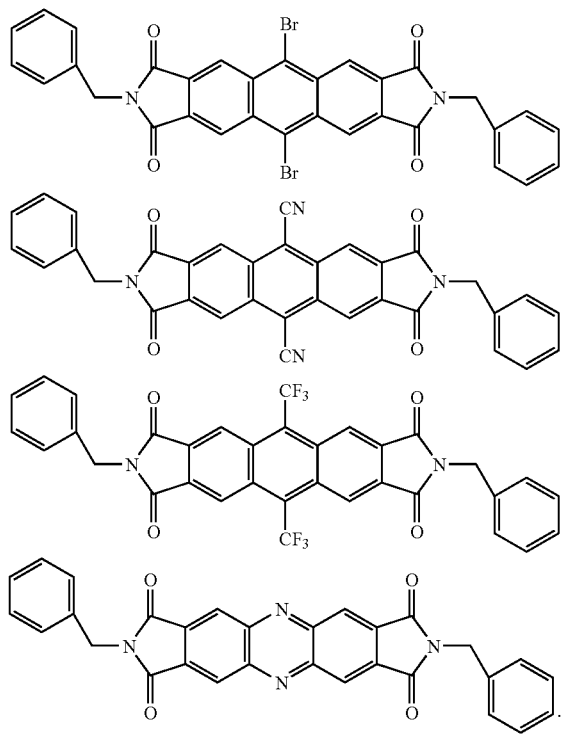

As certain embodiments of the compounds disclosed herein can be soluble in common solvents, compounds of the present teachings can offer processing advantages when used to fabricate electrical devices such as thin film semiconductors, field-effect devices, organic light emitting diodes (OLEDs), organic photovoltaics, photodetectors, capacitors, and sensors. As used herein, a compound can be considered soluble in a solvent when at least 1 mg of the compound is soluble in 1 mL of the solvent. Examples of common organic solvents include petroleum ethers; acetonitrile; aromatic hydrocarbons such as benzene, toluene, xylene, and mesitylene; ketones, such as acetone, and methyl ethyl ketone; ethers, such as tetrahydrofuran, dioxane, bis(2-methoxyethyl)ether, diethyl ether, di-isopropyl ether, and t-butyl methyl ether; alcohols, such as methanol, ethanol, butanol, and isopropyl alcohol; aliphatic hydrocarbons, such as hexanes; acetates, such as methyl acetate, ethyl acetate, methyl formate, ethyl formate, isopropyl acetate, and butyl acetate; halogenated aliphatic and aromatic hydrocarbons, such as dichloromethane, chloroform, ethylene chloride, chlorobenzene, dichlorobenzene, and trichlorobenzene; and cyclic solvents such as cyclopentanone, cyclohexanone, and 2-methypyrrolidone. Examples of common inorganic solvents include water and ionic liquids.

Various deposition techniques, including various solution processing techniques, have been used with organic electronics. For example, much of the printed electronics technology has focused on inkjet printing, primarily because this technique offers greater control over feature position and multilayer registration. Inkjet printing is a noncontact process, which offers the benefits of not requiring a preformed master (compared to contact printing techniques), as well as digital control of ink ejection, thereby providing drop-on-demand printing. However, contact printing techniques have the key advantage of being well-suited for very fast roll-to-roll processing. Exemplary contact printing techniques include, but are not limited to, screen-printing, gravure, offset, and microcontact printing. Other solution processing techniques include, for example, spin coating, drop-casting, dip coating, blade coating, or spraying.

The present teachings further provide compositions that comprise one or more compounds disclosed herein dissolved or dispersed in a liquid medium, for example, an organic solvent, an inorganic solvent, or combinations thereof (e.g., a combination of organic solvents, inorganic solvents, or organic and inorganic solvents). In some embodiments, such compositions can include one or more compounds disclosed herein, for example, one or more different compounds of the present teachings can be dissolved in an organic solvent to prepare a composition for deposition.

Various articles of manufacture, such as organic field effect transistors (e.g., thin film transistors), complementary metal oxide semiconductors (CMOS) circuitry, complementary inverters, D flip-flops and ring oscillators, which make use of the organic semiconducting compounds disclosed herein, are also within the scope of the present teachings.

The present teachings further provide methods of preparing a semiconductor or semiconductor material. The methods can include preparing a composition that includes one or more compounds (e.g., a mixture of regioisomers) disclosed herein in a liquid medium such as an organic solvent, an inorganic solvent or a mixture of solvents, and depositing the composition on a substrate to provide a semiconductor that includes one or more compounds disclosed herein. In some embodiments, the depositing step can be carried out by printing, including inkjet printing and various contact printing techniques (e.g., screen-printing, gravure, offset, pad, and microcontact printing). In other embodiments, the depositing step can be carried out by vacuum vapor deposition, spin coating, drop-casting, zone casting, dip coating, blade coating, or spraying.

The present teachings further provide articles of manufacture, for example, composites that include a semiconductor material of the present teachings and a substrate component and/or a dielectric component. The substrate component can be selected from materials including doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., the crosslinked polymer blends described in U.S. patent application Ser. Nos. 11/315,076, 60/816,952, and 60/861,308, the entire disclosure of each of which is incorporated by reference herein) and a self-assembled superlattice/self-assembled nanodielectric (SAS/SAND) material (described in Yoon, M-H. et al., *PNAS*, 102 (13): 4678-4682 (2005), the entire disclosure of which is incorporated by reference herein), as well as a hybrid organic/inorganic dielectric material (described in U.S. patent application Ser. No. 11/642,504, the entire disclosure of which is incorporated by reference herein). The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, solar cells, capacitors, complementary circuits (e.g., inverter circuits), and the like.

Another article of manufacture in which compounds of the present teachings are useful is photovoltaics or solar cells. Compounds of the present teachings can exhibit relatively broad optical absorption and/or a positively shifted reduction potential making them desirable for such applications. Accordingly, the compounds described herein can be used as a n-type semiconductor in a photovoltaic design, which includes an adjacent p-type semiconducting material that forms a p-n junction. The compounds can be in the form of a thin film semiconductor, which can be a composite of the thin film semiconductor deposited on a substrate. Exploitation of compounds of the present teachings in such devices is within the knowledge of the skilled artisan.

Accordingly, another aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

In certain embodiments, OTFT devices can be fabricated with the present compounds on doped silicon substrates, using $SiO_2$ as the dielectric, in top-contact geometries. In particular embodiments, the active semiconducting layer which incorporates at least a compound of the present teachings can be deposited by vacuum vapor deposition at room temperature or at an elevated temperature. In other embodiments, the active semiconducting layer which incorporates at least a compound of the present teachings can be applied by spin-coating or jet printing. For top-contact devices, metallic contacts can be patterned on top of the films using shadow masks.

The following examples are provided to illustrate further and to facilitate the understanding of the present teachings and are not in any way intended to limit the invention.

Example 1

Synthesis of Organic Semiconductor Intermediates

A. Preparation of N-octylmaleimide

To a suspension of maleic anhydride (3.0 g, 30.6 mmol) in 80 mL of benzene, a solution of octylamine (3.59 g, 27.8 mmol) in 50 mL of benzene was added. The resulting mixture was stirred at 30° C. for an hour and zinc bromide ($ZnBr_2$, 6.89 g, 30.6 mmol) and hexamethyl disilazane (6.72 g, 41.7 mmol) in 20 mL of benzene were added. The resulting suspension was heated under reflux for 2 hours. After cooling to room temperature, the reaction mixture was poured into 200 mL of 0.5 M hydrochloric acid (HCl). The organic layer was separated and the aqueous portion was extracted twice with 150 mL portions of ethyl acetate (EtOAc). The combined organic layers were washed with saturated aqueous sodium bicarbonate ($NaHCO_3$, 2×150 mL), brine (1×150 mL), and dried over magnesium sulfate ($MgSO_4$). The solution was concentrated under vacuum to yield a viscous solid, which is subsequently sublimed to produce N-octylmaleimide as a white solid (4.8 g, 92%). $^1H$ NMR (400 MHz, $CDCl_3$): δ 0.87 (t, 3H, J=6 Hz), 1.20-1.40 (m, 10H), 1.50-1.70 (m, 2H), 3.51 (t, 2H, J=6 Hz), 6.69 (s, 2H).

B. Preparation of N-2,3,4,5,6-pentafluorophenylmaleimide

A solution of pentafluorophenylamine (5.09 g, 27.8 mmol) in 50 mL of benzene was added to a solution of maleic anhydride (3.0 g, 30.6 mmol) in 80 mL of benzene. The resulting yellow solution was stirred at 30° C. for an hour. Then $ZnBr_2$ (6.89 g, 30.6 mmol) and hexamethyl disilazane (6.72 g, 41.7 mmol) in 20 mL of benzene were added. The resulting suspension was heated under reflux for 4 hours. After cooling to room temperature, the reaction mixture was poured into 200 mL of 0.5 M HCl. The organic layer was separated and the aqueous portion was extracted twice with 150 mL portions of EtOAc. The combined organic layers were washed with saturated aqueous $NaHCO_3$ (2×150 mL), brine (1×150 mL), and dried over $MgSO_4$. The solution was concentrated under vacuum to yield a viscous brown solid, which is subsequently sublimed twice to produce N-2,3,4,5,6-pentafluorophenylmaleimide as a white crystalline solid (5.3 g, 73%). $^1H$ NMR (400 MHz, $CDCl_3$): δ 6.91 (s, 2H); and $^{19}F$ NMR (376 MHz, $CDCl_3$): δ −143.26, −151.39, −161.0 ppm.

C. Preparation of 1,2,4,5-Tetrakis(dibromomethyl)benzene 1,2,4,5-Tetramethylbenzene (1.0 g, 7.46 mmol) was dissolved in 40 mL of carbon tetrachloride. The solution was heated to reflux and irradiated with a 200 W sun lamp. Bromine (3.06 mL, 59.7 mmol) was slowly added to the solution. After 48 hours, the product was collected by filtration, washed with boiling chloroform, and recrystallized from dioxane, to provide 3.2 g (4.18 mmol) of 1,2,4,5-tetrakis (dibromomethyl)benzene (56% yield). $^1$H NMR (400 MHz, 1,1,2,2-tetrachloroethane-$d_2$): δ 8.0 (s, 2H), 7.1 (s, 4H).

D. Preparation of 1,4-dibromo-2,3,5,6-tetramethylbenzene

Chloroform (25 mL), 1,2,4,5-tetramethylbenzene (6.7 g, 0.05 mol), and aluminum chips (20 mg) were placed in a 250 mL flask, stirred and cooled to 0° C. Bromine (5.13 mL, 0.1 mol) was added dropwise over a long period of time, and the reaction was allowed to continue for two additional hours, which was followed by addition of chloroform (40 mL) to dissolve the precipitated crystalline. The solution was condensed to 40 mL and recrystallized at 5° C. to give 4.2 g of colorless crystals after filtration. The filtrate was evaporated and the solid was recrystallized from chloroform/methanol (1:1) to give a second fraction of pure product (6.0 g). The combined total yield of 1,4-dibromo-2,3,5,6-tetramethylbenzene was 12 g (82%). $^1$H NMR (400 MHz, CDCl$_3$): δ 2.4 (s, 12H).

E. Preparation of 1,4-dibromo-2,3,5,6-tetrakis(bromomethyl)benzene 1,4-Dibromo-2,3,5,6-tetramethylbenzene (2.92 g, 0.01 mol) was dissolved in 100 mL of carbon tetrachloride. The solution was heated to reflux and irradiated with a 200 W sun lamp. Bromine (4.10 mL, 0.08 mmol) was slowly added to the solution. After 48 hours, the product was collected by filtration, washed with water and then boiling chloroform to provide 5.1 g (4.18 mmol) of 1,4-dibromo-1,2,4,5-tetrakis(bromomethyl)benzene (55% yield). $^1$H NMR (400 MHz, 1,1,2,2-tetrachloroethane-$d_2$): δ 4.85 (s, 12H); and Elemental Analysis (Calcd for $C_{10}H_4Br_{10}$: C, 19.77; H, 1.33; Br, 78.91). found: C, 20.02; H, 1.20; Br, 78.77.

F. Preparation of N,N'-Bis(1H,1H-perfluorobutyl)-9,10-dibromo-1,2,3,4,5,6,7,8-octahydro-2,3:6,7-anthracenedicarboximide Following the procedures described above in Example 1E, but using N-(1H,1H-perfluorobutyl)maleimide (2.79 g, 0.01 mol) as a starting material, 3.3 g of N,N'-bis(1H,1H-perfluorobutyl)-2,3:6,7-anthracenedicarboximide was obtained (79% yield). $^1$H NMR (400 MHz, CDCl$_3$): δ 3.8 (t, 4H), 3.3 (d, 8H), 2.7 (d, 4H). $^{19}$F NMR (376 MHz): δ −81.0, −118.0, −128.2.

Example 2

N,N'-Di-n-octyl-2,3:6,7-anthracenedicarboximide (ADI8)

Sodium iodide (NaI, 4.2 g) was added to a solution of 1,2,4,5-tetrakis(dibromomethyl)benzene (0.68 g, 0.89 mmol) and N-n-octylmaleimide (0.335 g, 1.79 mmol) in N,N-dimethylacetamide (10 mL). The mixture was heated at 80° C. for 12 hours during which time a precipitate formed. The precipitate was collected by filtration, washed with water and boiling dioxane to provide 0.40 g of N,N'-di-n-octyl-2,3:6,7-anthracenedicarboximide as a bright yellow solid (0.30 g, 0.55 mmol, 21% yield). Additional purification can be achieved by gradient sublimation. M.p.>300° C.; and Elemental Analysis (Calcd for $C_{34}H_{40}N_2O_4$: C, 75.53; H, 7.46; N, 5.18). found: C, 74.78; H, 7.10; N, 5.07.

FIG. 1 is $^1$H NMR spectra of N,N'-di-n-octyl-2,3:6,7-anthracenedicarboximide in deuterated chloroform (CDCl$_3$).

Example 3

N,N'-Dibenzyl-2,3:6,7-anthracenedicarboximide (ADI1Ph)

NaI (4.0 g) was added to a solution of 1,2,4,5-tetrakis(dibromomethyl)benzene (2.0 g, 2.61 mmol) and N-benzylmaleimide (0.977 g, 5.22 mmol) in N,N-dimethylacetamide (25 mL). The mixture was heated at 80° C. for 12 hours. The product was collected from the dark solution by filtration, and washed with water and boiling dioxane to provide 0.40 g of N,N'-dibenzyl-2,3:6,7-anthracenedicarboximide as a bright yellow solid (31% yield). Additional purification can be achieved by gradient sublimation. M.p.>300° C.; $^1$H NMR (400 MHz, DMSO-$d_6$, 130° C.): δ 9.2 (s, 2H), 8.7 (s, 4H), 7.2-7.4 (m, 10H), 4.8 (s, 4H); and Elemental Analysis (Calcd for $C_{32}H_{20}O_4N_2$: C, 77.42; H, 4.03; N, 5.65). found: C, 77.25; H, 4.09; N, 5.69.

Figure 2:
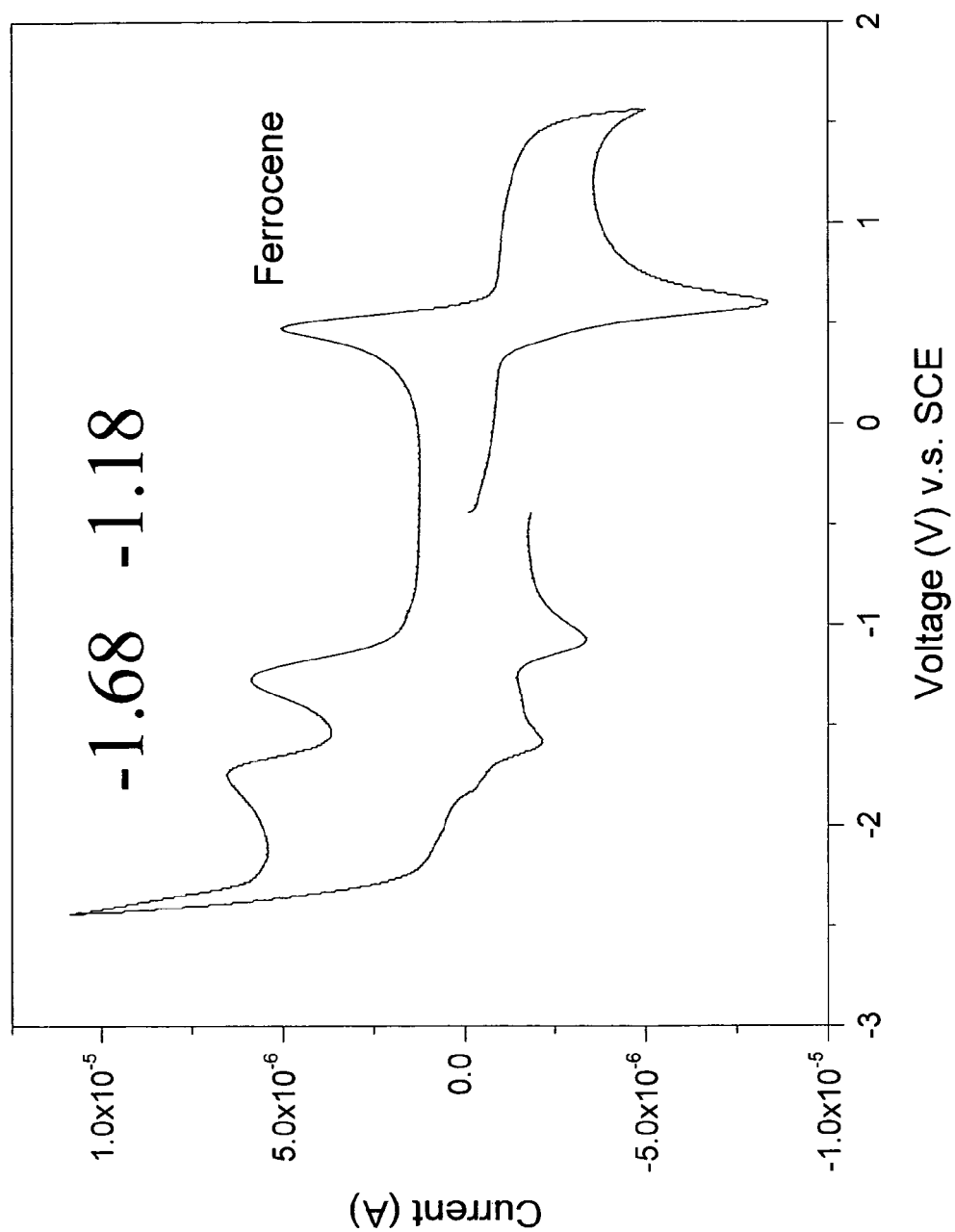
FIG. 2 is a cyclic voltammogram of a compound of the present teachings (ADI1Ph) in tetrahydrofuran using a carbon working electrode, a platinum counter electrode, and a silver wire pseudo-reference electrode. The electrolyte is tetrabutylammonium tetrafluoroborate (Bu$_4$NBF$_4$).

FIG. 2 is a cyclic voltammogram of N,N'-dibenzyl-2,3:6,7-anthracenedicarboximide in tetrahydrofuran using a carbon working electrode, a platinum counter electrode, and a silver wire pseudo-reference electrode. The electrolyte is tetrabutylammonium tetrafluoroborate (Bu$_4$NBF$_4$).

Example 4

N,N'-Dicyclohexyl-2,3:6,7-anthracenedicarboximide (ADICy)

Following procedures analogous to those described in Examples 2 and 3 but using N-cyclohexylmaleimide (0.94 g, 5.22 mmol) as the starting material, 0.40 g of N,N'-dicyclohexyl-2,3:6,7-anthracenedicarboximide was obtained (30% yield). Additional purification can be achieved by gradient sublimation. M.p.>300° C.; $^1$H NMR (400 MHz, DMSO-$d_6$, 130° C.): δ 9.2 (s, 2H), 8.7 (s, 4H), 4.1 (s, 2H), 2.2 (m, 4H), 1.2-2.0 (m, 18H); and Elemental Analysis (Calcd for $C_{30}H_{28}O_4N_2$: C, 74.98; H, 5.83; N, 5.83). found: C, 74.80; H, 5.74; N, 5.92.

Example 5

N,N'-Di-(2,3,4,5,6-pentafluorophenyl)-2,3:6,7-anthracenedicarboximide (ADIPh$^F$)

Following procedures analogous to those described in Examples 2 and 3 but using N-2,3,4,5,6-pentafluorophenylmaleimide as the starting material, 0.10 g of N,N'-di-(2,3,4,5,6-pentafluorophenyl)-2,3:6,7-anthracenedicarboximide was obtained (6% yield). Additional purification can be achieved by gradient sublimation. M.p.>300° C.; and Elemental Analysis (Calcd for $C_{30}H_6F_{10}N_2O_4$: C, 55.57; H, 0.93; N, 4.32; F, 29.30). found: C, 55.87; H, 0.93; N, 4.26; F, 29.29.

Figure 3:
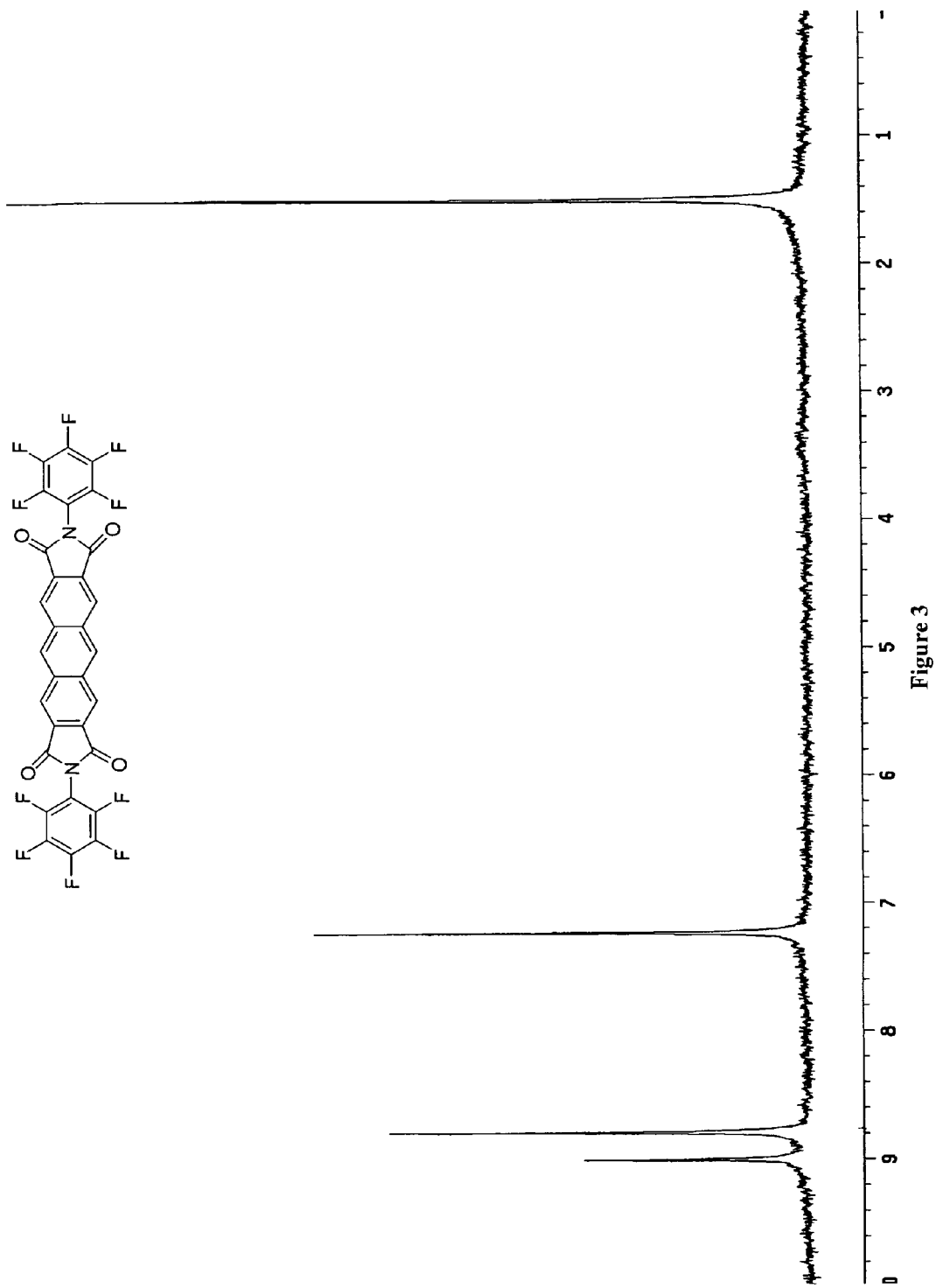
FIG. 3 is a $^1$H NMR spectrum of a compound of the present teachings (ADIPh$^F$) in CDCl$_3$.

FIG. 3 is $^1$H NMR spectra of N,N'-di-(2,3,4,5,6-pentafluorophenyl)-2,3:6,7-anthracenedicarboximide in deuterated chloroform (CDCl$_3$).

Example 6

N,N'-Bis[(3S)-3,7-dimethyl-6-octenyl]-2,3:6,7-anthracenedicarboximide (ADICitr)

NaI (4.2 g) was added to a solution of 1,2,4,5-tetrakis(dibromomethyl)benzene (0.68 g, 0.89 mmol) and N-[(3S)-3,7-dimethyl-6-octenyl]maleimide (0.421 g, 1.79 mmol) in N,N-dimethylacetamide (7 mL). The mixture was heated at 80° C. for 12 hours during which time a precipitate formed. The precipitate was collected by filtration, washed with water and methanol (MeOH) to provide 0.244 g of N,N'-bis[(3S)-3,7-dimethyl-6-octenyl]-2,3:6,7-anthracenedicarboximide as a bright yellow solid (0.41 mmol, 23% yield). M.p.=231-233° C. (DMF-iPrOH); $^1$H NMR (400 MHz, CDCl$_3$): δ 8.82 (s, 2H), 8.55 (s, 4H), 5.15 (t, 2H, J=7.1 Hz), 4.25 (t, 4H, J=7.8 Hz), 2.15-1.95 (m, 4H), 1.80-1.40 (m, 6H), 1.66 (s, 6H), 1.64 (s, 6H), 1.40-1.21 (m, 4H), 1.00 (d, 6H, J=6.4 Hz); and HRMS (Calcd for $C_{38}H_{44}N_2O_4$: 592.3301). found: 592.3309.

Example 7

N,N'-Dibenzyl-2,3:6,7-anthracenedicarboximide-9,10(8aH, 10aH)-dione (ADIQ1Ph)

A suspension of N,N'-dibenzyl-2,3:6,7-anthracenedicarboximide (500 mg, 0.95 mmol) and chromium oxide (CrO$_3$, 80 mg) in acetonitrile (100 mL) was heated under reflux for 24 hours. The mixture was then cooled to room temperature and filtered. After the filtrate was evaporated, N,N'-dibenzyl-2,3:6,7-anthracenedicarboximide-9,10(8aH, 10aH)-dione was obtained as a yellow powder (180 mg, 35% yield). Additional purification can be achieved by gradient sublimation. M.p.>300° C.; $^1$H NMR (400 MHz, DMSO-d$_6$): δ 8.5 (s, 4H), 7.2-7.4 (m, 10H), 4.8 (s, 4H); and MALDI-TOF-MS (m/z, calcd for $C_{32}H_{18}O_6N_2$ [M$^+$H]: 527.1). found: 527.2.

Example 8

N,N'-Di-n-octyl-9,10-dibromo-1,2,3,4,5,6,7,8-octahydro-2,3:6,7-anthracenedicarboximide 1,4-Dibromo-2,3,5,6-tetrakis(bromomethyl)benzene (500 mg, 0.82 mmol), N-octyl maleimide (344 mg, 1.64 mmol) and dry NaI (1.22 g, 8.2 mmol) were placed in a 25 mL flask containing 5 mL of dimethylformamide (DMF) under nitrogen. The mixture was heated up to 85° C. for 36 hours. The reaction mixture turned brown during the course of the reaction. The product mixture was cooled to room temperature, and poured into 500 mL of water, to give 500 mg of the raw product (85% yield). Additional purification can be achieved by gradient sublimation. $^1$H NMR (400 MHz, CDCl$_3$): δ 3.80 (d, 4H), 3.25 (m, 8H), 2.75 (d, 4H), 1.25-0.95 (broad m, 20H), 0.85 (m, 4H), 0.75 (t, 6H); and HRMS (Calcd for $C_{34}H_{46}Br_2N_2O_4$: 704.1824). found: 704.1832.

Example 9

N,N'-Di-n-octyl-9,10-dibromo-2,3:6,7-anthracenedicarboximide

N,N'-Di-n-octyl-9,10-dibromo-1,2,3,4,5,6,7,8-octahydro-2,3:6,7-anthracenedicarboximide (100 mg, 0.14 mmol), N-bromosuccinimide (251.9 mg, 1.41.mmol), and benzoyl peroxide (3.5 mg) were placed in a 100 mL flask with 25 mL of carbon tetrachloride. The stirred reaction mixture was purged with nitrogen and then heated to reflux in the dark for 15 hours. The reaction mixture turned yellow during the course of the reaction and, after cooling to room temperature, 1 mL of triethylamine was added. A precipitate formed after stirring for 4 hours. The precipate was collected by filtration, washed with water, and concentrated to give 70 mg of N,N'-di-n-octyl-9,10-dibromo-2,3:6,7-anthracenedicarboximide (71% yield). $^1$H NMR (400 MHz, CDCl$_3$): δ 8.82 (s, 4H), 3.85 (t, 4H), 1.65 (d, 4H), 1.45-0.95 (broad m, 24H), 0.85 (t, 6H); and HRMS (Calcd for $C_{34}H_{38}Br_2N_2O_4$: 696.1198). found: 696.1192.

Example 10

N,N'-Di-n-octyl-9,10-dicyano-2,3:6,7-anthracenedicarboximide (ADI8-CN$_2$)

To a 25 mL flask was added 80 mg of N,N'-Di-n-octyl-9,10-dibromo-2,3:6,7-anthracenedicarboximide (0.1145 mmol), 185 mg CuCN (2.06 mmol) and 5 mL DMF. The reaction mixture was stirred under nitrogen for 12 h at 150° C. After the reaction mixture had cooled to room temperature, an aqueous ammonium hydroxide solution (200 mL) was added. The resulting brown solid that precipitated from the green solution was collected by filtration and washed with large quantities of water. The resulting solid was then extracted with chloroform, the chloroform solution filtered, and the filtrate evaporated and dried under vacuum. The resulting dark-yellow solid was next chromatographed on silica, eluting with chloroform/acetone (100:1 v/v). Recrystallization from CH$_2$Cl$_2$/isopropanol solution was used to further purify the chromatographed solid, yielding 50 mg (67%). M.p.>300° C.; $^1$H NMR (400 MHz, CHCl$_3$): δ 9.05 (s, 4H), 3.85 (t, 4H), 1.75 (d, 4H), 1.45-0.95 (broad m, 24H), 0.85 (t, 6H); MS-MALDI (Calcd for $C_{36}H_{38}N_4O_4$: 590.71). found: 590.6; and Elemental Analysis (Calcd for $C_{36}H_{38}N_4O_4$: C, 73.20; H, 6.48; N, 9.48). found: C, 73.30; H, 6.51; N, 9.53.

Figure 4:
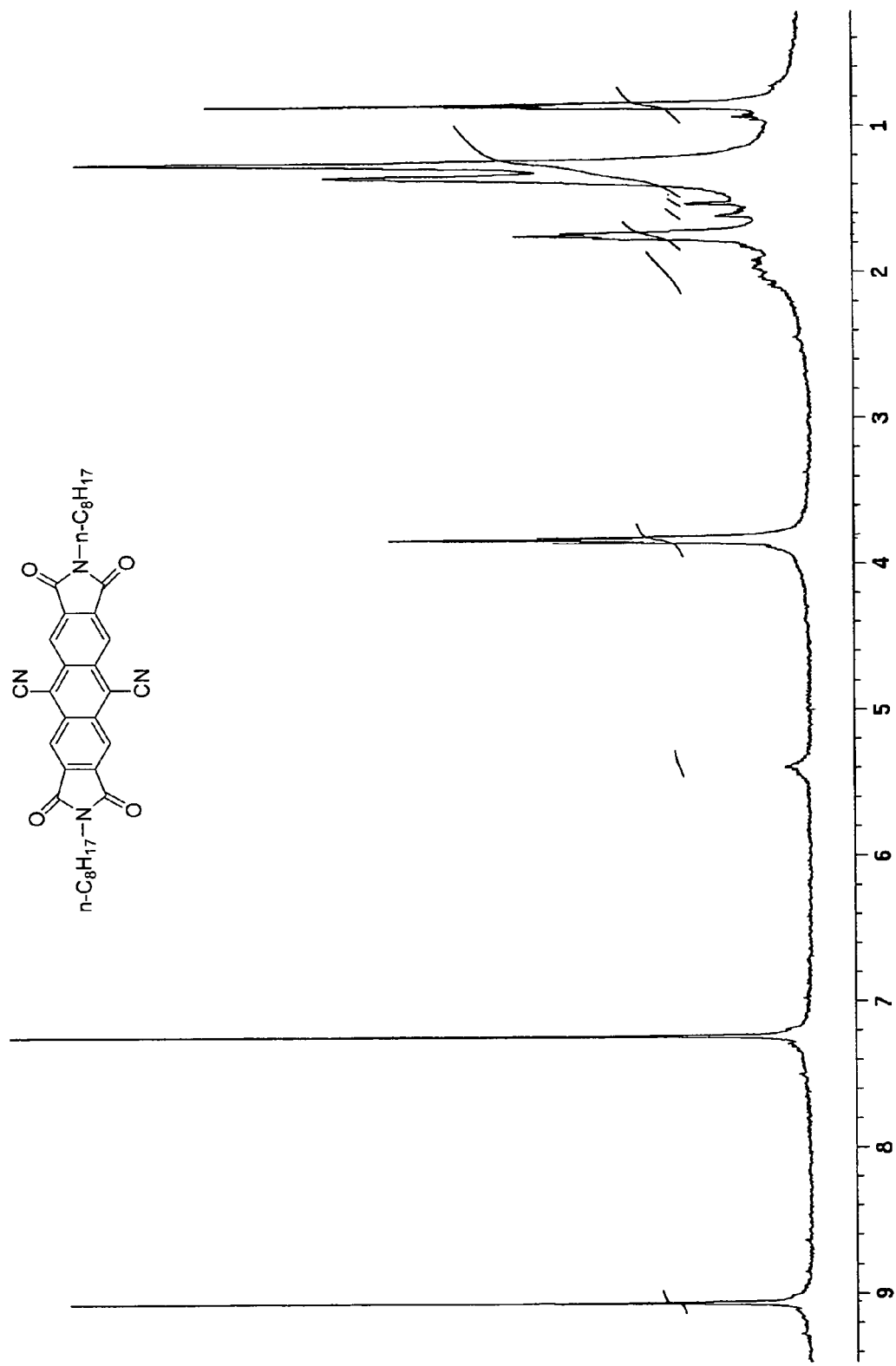
FIG. 4 is a $^1$H NMR spectrum of a compound of the present teachings (ADI8-CN$_2$) in deuterated chloroform (CDCl$_3$).

FIG. 4 is $^1$H NMR spectra of N,N'-di-n-octyl-9,10-dicyano-2,3:6,7-anthracenedicarboximide in deuterated chloroform (CDCl$_3$).

Figure 5:
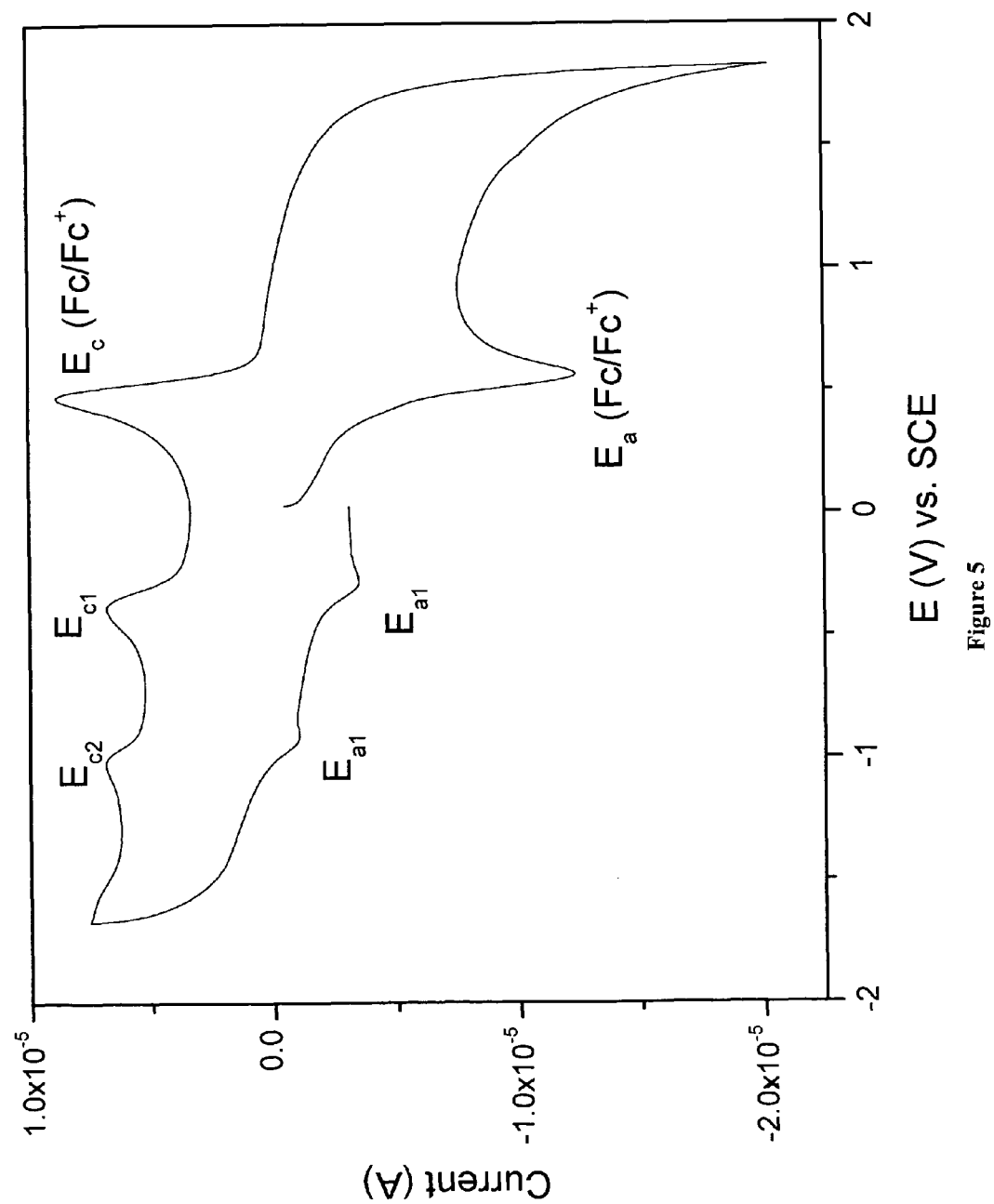
FIG. 5 is a cyclic voltammogram of a compound of the present teachings (ADI8-CN$_2$) in tetrahydrofuran using a carbon working electrode, a platinum counter electrode, and a silver wire pseudo-reference electrode. The electrolyte is tetrabutylammonium tetrafluoroborate (Bu$_4$NBF$_4$).

FIG. 5 is a cyclic voltammogram of N,N'-di-n-octyl-9,10-dicyano-2,3:6,7-anthracenedicarboximide in tetrahydrofuran using a carbon working electrode, a platinum counter electrode, and a silver wire pseudo-reference electrode. The electrolyte is tetrabutylammonium tetrafluoroborate (Bu$_4$NBF$_4$).

Example 11

Preparation of N,N'-bis{4-[(3S)-3,7-dimethyl-6-octenyl]phenyl}-2,3:6,7-anthracenedicarboximide (ADIPhCitr)

NaI (3.7 g) was added to a solution of 1,2,4,5-tetrakis(dibromomethyl)benzene (1.92 g, 2.50 mmol) and N-{4-[(3S)-3,7-dimethyl-6-octenyl]}phenylmaleimide (1.56 g, 5.00 mmol) in N,N-dimethylacetamide (15 mL). The reaction mixture was heated at 85° C. for 16 hours during which time a precipitate formed. The solid was collected by filtration, washed with water and MeOH, and finally concentrated to give N,N'-bis{4-[(3S)-3,7-dimethyl-6-octenyl]phenyl}-2,3:6,7-anthracenedicarboximide as a bright yellow solid (0.51 g, 0.68 mmol, 27% yield). Additional purification can be achieved by recrystallization from DMF-TCB. $^1$H NMR (400 MHz, CDCl$_3$): δ 8.83 (s, 2H), 8.61 (s, 4H), 7.39 (d, 4H, J=8.0 Hz), 7.21 (d, 4H, J=8.0 Hz), 5.20 (t, 2H, J=7.2 Hz), 2.71 (t, 4H, J=7.6 Hz), 2.16-1.96 (m, 4H), 1.82-1.40 (m, 6H), 1.67 (s, 6H), 1.63 (s, 6H), 1.40-1.20 (m, 4H), 1.02 (d, 6H, J=6.6 Hz); and Elemental Analysis (Calcd for $C_{50}H_{52}O_4N_2$: C, 80.61; H, 7.04; N, 3.76). found: C, 80.55; H, 7.38; N, 4.04.

Example 12

Preparation of N,N'-Bis(1H,1H-perfluorobutyl)-9,10-dibromo-2,3:6,7-anthracenedicarboximide (ADIF-Br$_2$)

Following the previous procedure described for ADI8-Br2 but using N,N'-bis(1H,1H-perfluorobutyl)-9,10-dibromo-1,2,3,4,5,6,7,8-octahydro-2,3:6,7-anthracenedicarboximide (0.5 g, 2.36 mmol) as a starting material, 0.36 g of N,N'-bis(1H,1H-perfluorobutyl)-9,10-dibromo-2,3:6,7-anthracenedicarboximide was obtained (73% yield). $^1$H NMR (400 MHz, CDCl$_3$): δ 9.28 (s, 4H), 4.50 (t, 4H); $^{19}$F NMR (376 MHz): δ −80.8, −117.0, −127.8; and Elemental Analysis (Calcd for C$_{26}$H$_8$Br$_2$F$_{14}$N$_2$O$_4$: C, 37.26; H, 0.96; N, 3.34). found: C, 37.41; H, 1.03; N, 3.33.

Example 13

Preparation of N,N'-Bis(1H,1H-perfluorobutyl)-9,10-dicyano-2,3:6,7-anthracenedicarboximide (ADIF—CN$_2$)

Following the previous procedure described for ADI8-CN2 but using N,N'-bis(1H,1H-perfluorobutyl)-9,10-dibromo-2,3:6,7-anthracenedicarboximide (ADIF-Br2) (0.36 g 0.43 mmol) as a starting material, 200 mg of N,N'-bis(1H,1H-perfluorobutyl)-9,10-dicyano-2,3:6,7-anthracenedicarboximide was obtained (64%, yield). $^1$H NMR (400 MHz, CDCl$_3$): δ 9.20 (s, 4H), 4.53 (t, 4H); $^{19}$F NMR (376 MHz): δ −80.8, −116.9, −127.8; MALDI-TOF-MS (Calcd: 731.04). found: 731.23; and Elemental Analysis (Calcd for C$_{26}$H$_8$Br$_2$F$_{14}$N$_2$O$_4$: C, 46.05; H, 1.10; N, 7.67; F, 36.42). found: C, 45.75; H, 1.21; N, 7.67; F, 36.54.

Example 14

FET Device Fabrication and Measurements

TFT devices [100 μm channel lengths (L) and 4.0 mm channel widths (W)] were fabricated with N,N'-dibenzyl-2,3:6,7-anthracenedicarboximide (ADI1Ph), N,N'-dicyclohexyl-2,3:6,7-anthracenedicarboximide (ADICy), N,N'-di-n-octyl-2,3:6,7-anthracenedicarboximide (ADI9), and N,N'-dipentafluorophenyl-2,3:6,7-anthracenedicarboximide (ADIPh$^F$) using the top-contact configuration. These semiconductors were vacuum-deposited (2-4 Å s$^{-1}$, P≈10$^{-6}$ Torr) onto n-doped Si/SiO$_2$ substrates, which had been pretreated with hexamethyldisilazane and were maintained at the temperatures (T$_D$) 25° C. and 70° C. The gate region was accessed by an ohmic contact to the Si, and Au source and drain contacts were evaporated through a shadow mask onto the semiconductor layer. All electrical measurements were performed under vacuum (~10$^{-4}$ Torr). Data reported below were average values as measured from at least three devices tested at different places on the semiconductor film.

Figure 6:
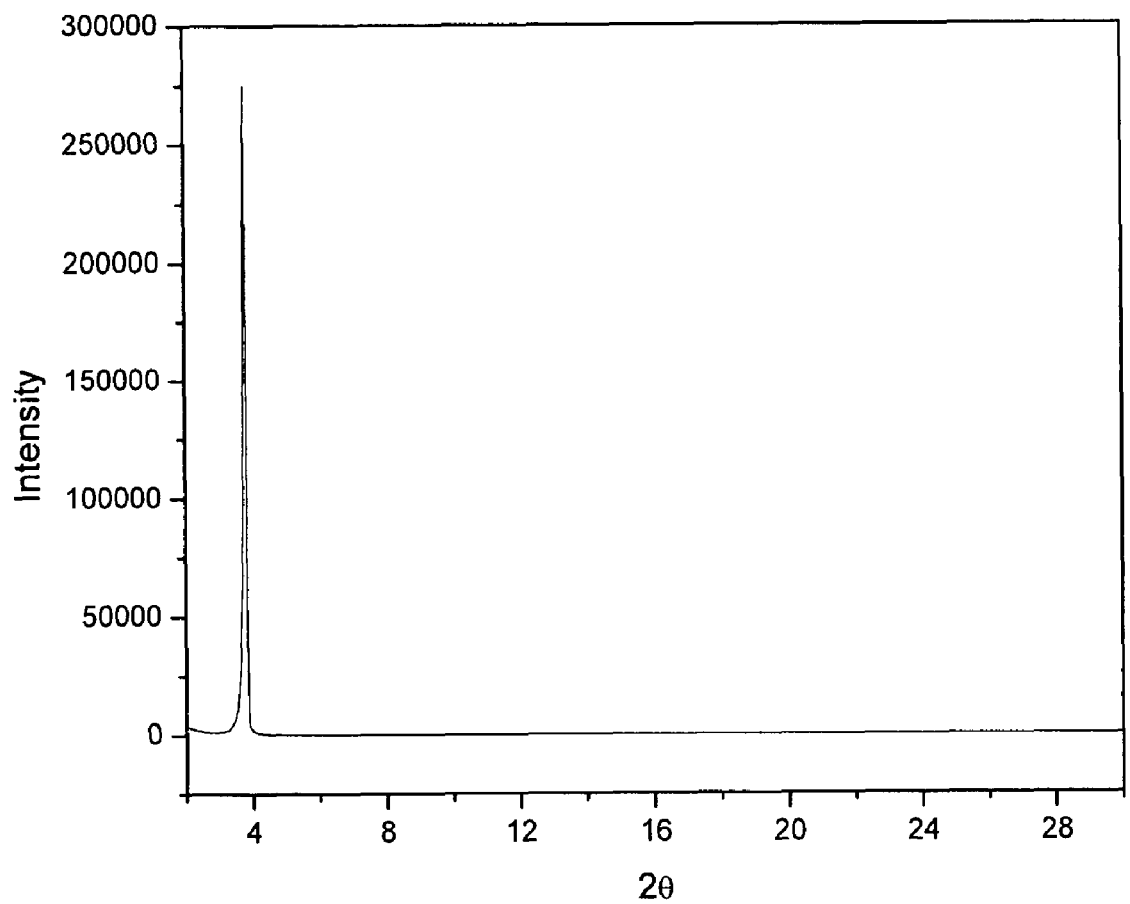
FIG. 6 provides an XRD scan of a 50 nm-thick vapor-deposited film of a compound of the present teachings (ADI1Ph) on a HMDS-treated Si—SiO$_2$ substrate.

FIG. 6 is an XRD scan of a 50 nm-thick ADI1Ph film vapor-deposited on a HMDS-treated Si—SiO$_2$ substrate.

Figure 7A:
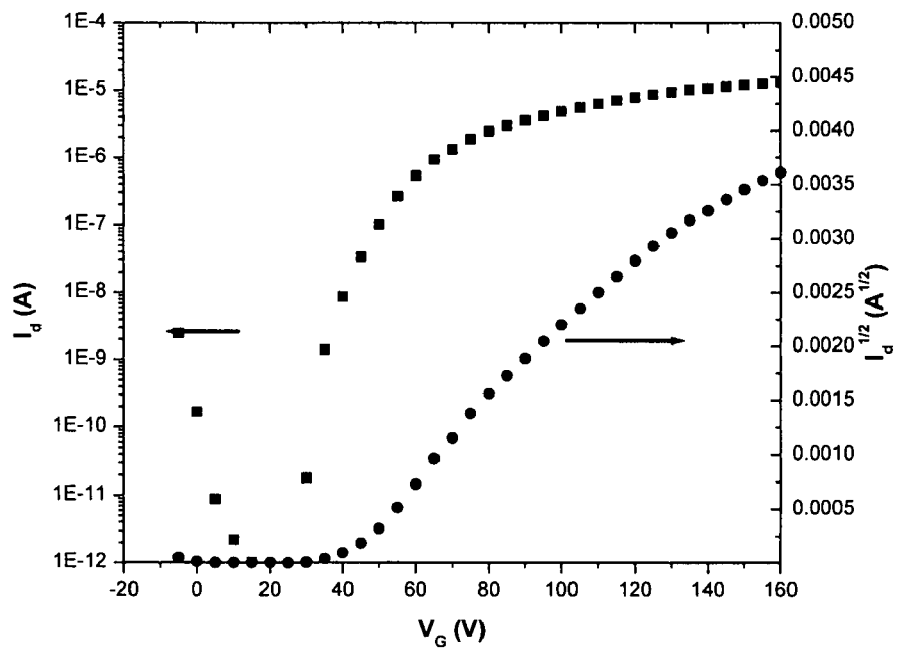
FIGS. 7A and 7B are representative transfer and output plots, respectively, of a compound of the present teachings (ADI8).
Figure 7B:
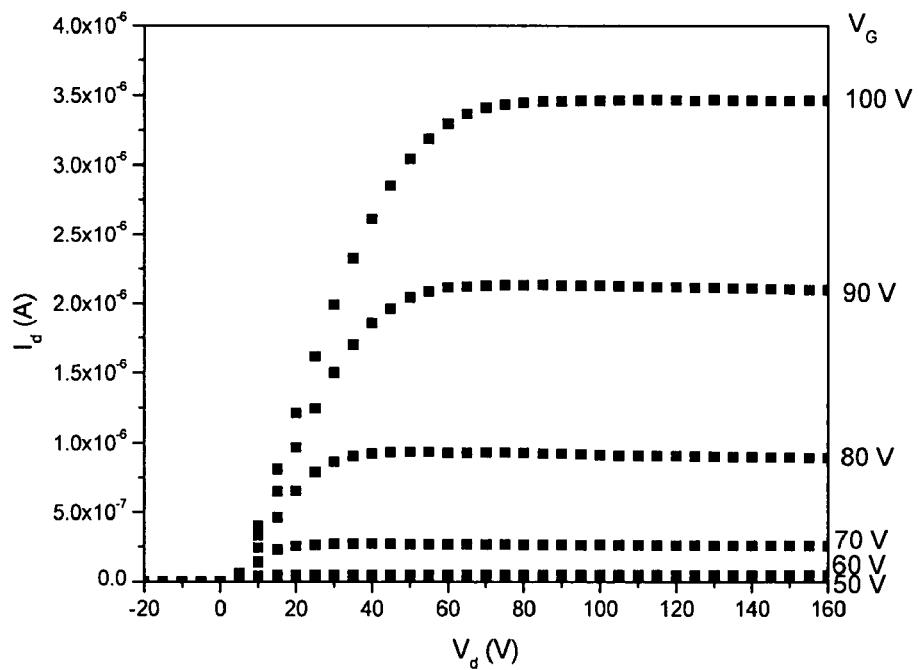
Figure 8A:
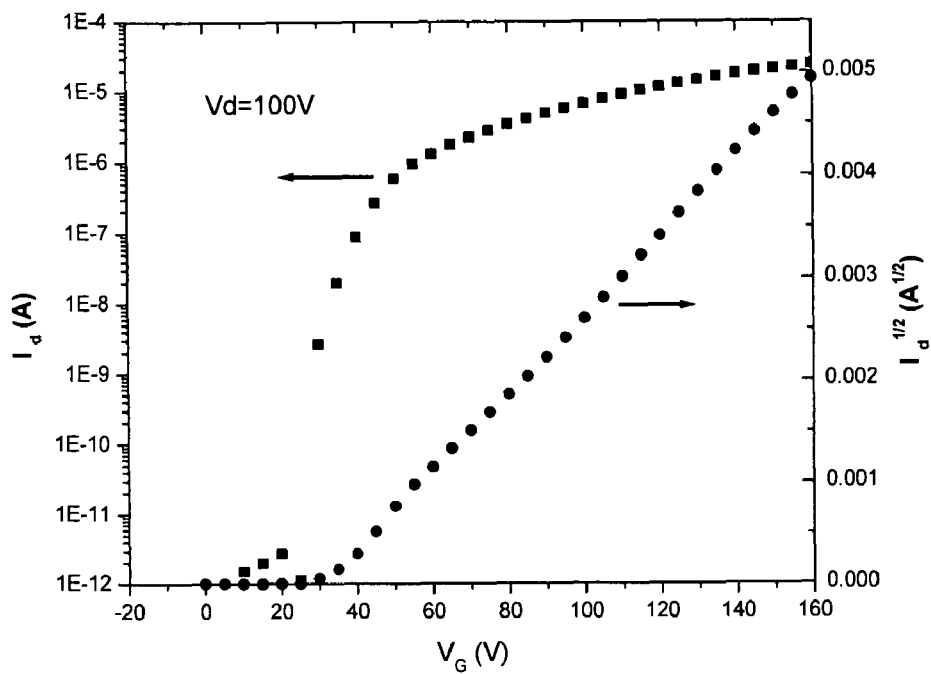
FIGS. 8A and 8B are representative transfer and output plots, respectively, of a compound of the present teachings (ADI1Ph).
Figure 8B:
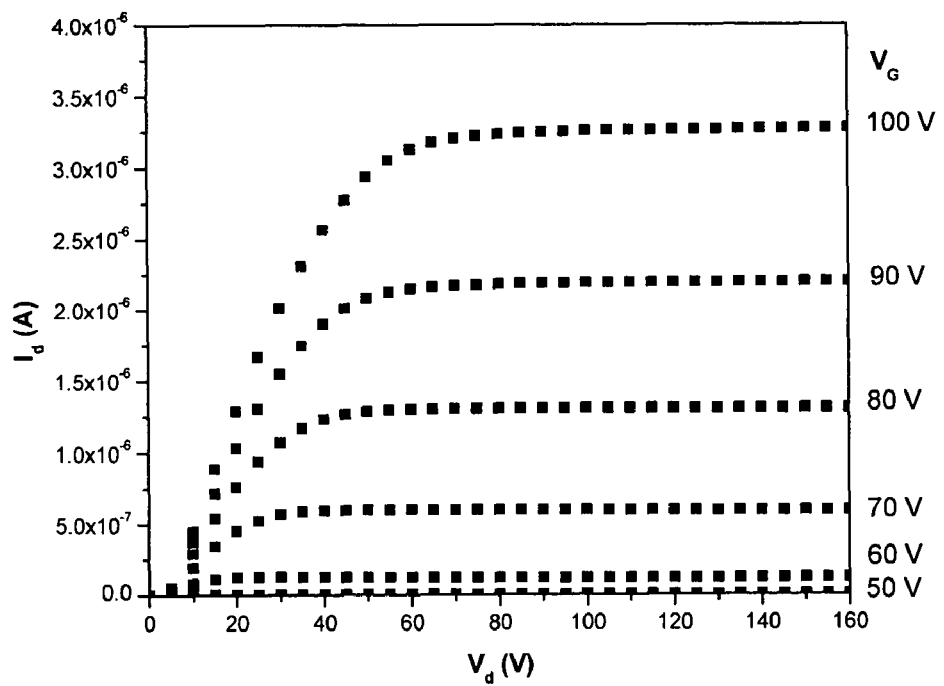
Figure 9A:
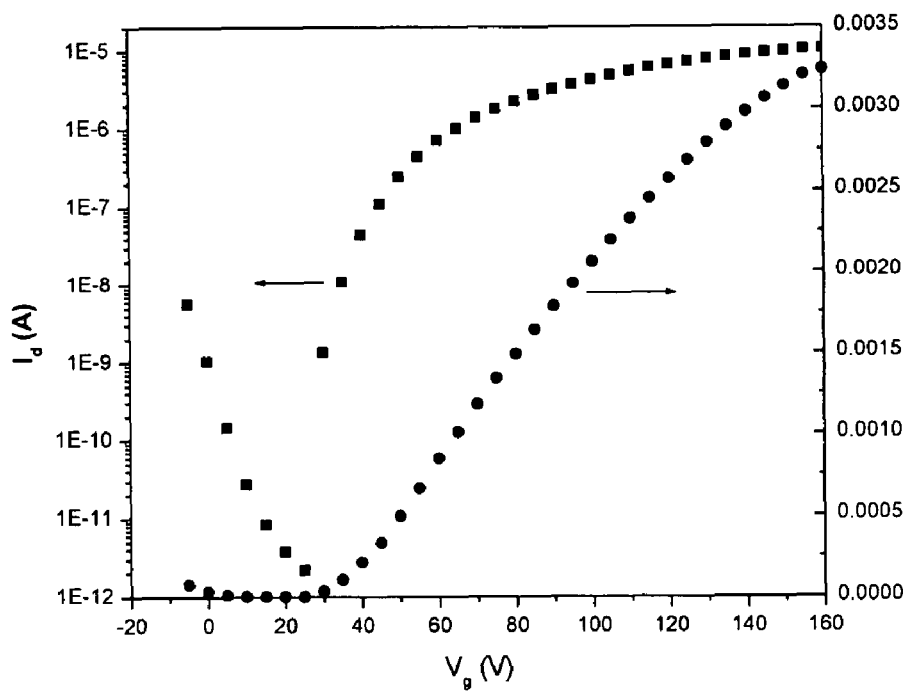
FIGS. 9A and 9B are representative transfer and output plots, respectively, of a compound of the present teachings (ADICy).
Figure 9B:
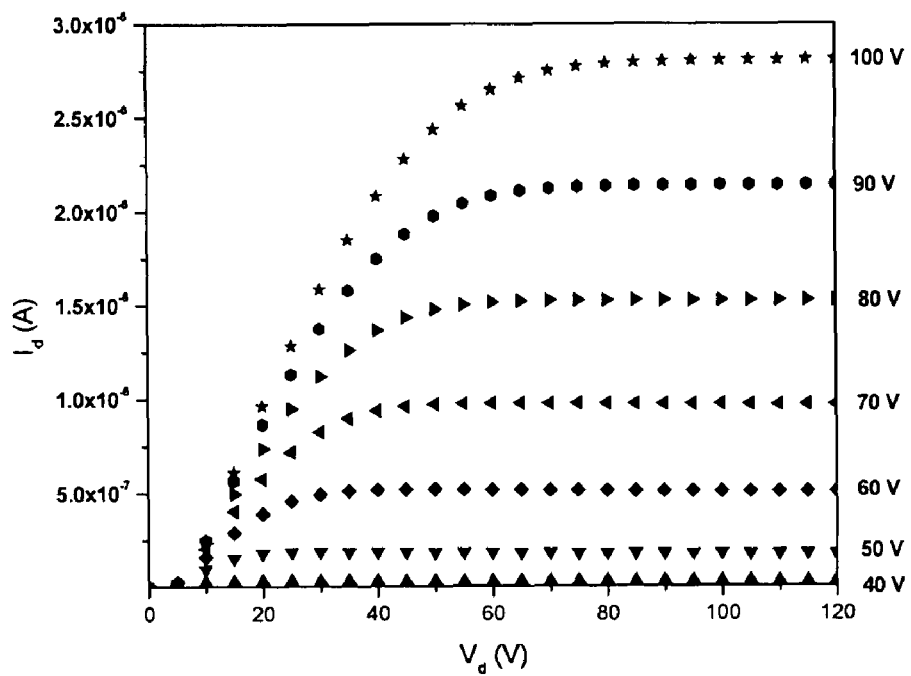
Figures 10A, 10B:
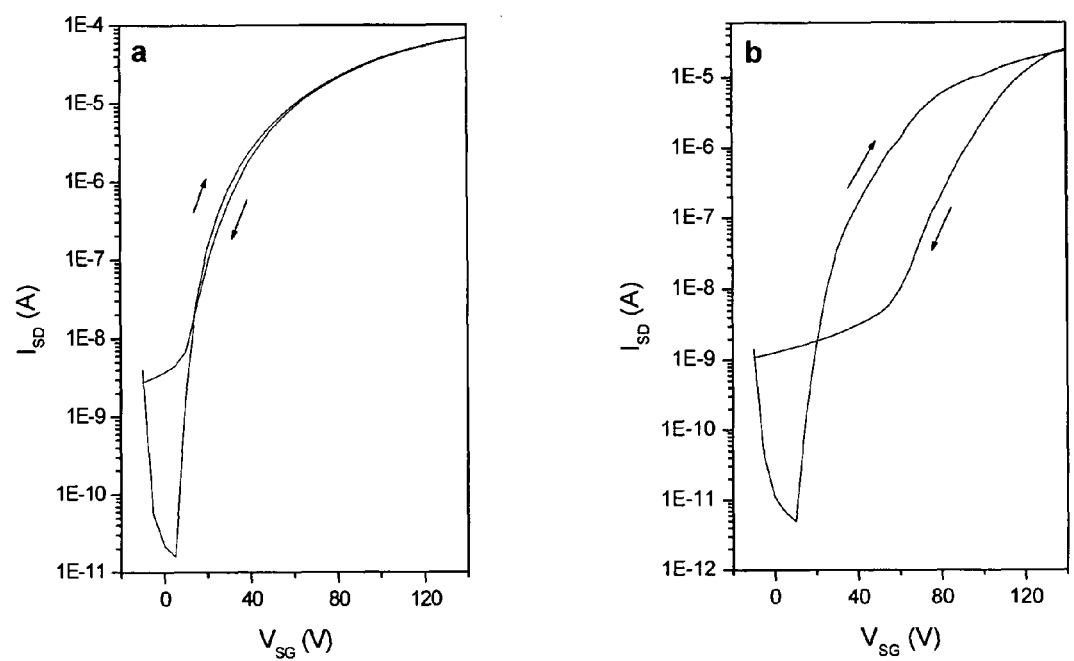
FIGS. 10a and 10b are representative transfer plots in a vacuum and in air, respectively, of a compound of the present teachings (ADI8-CN$_2$).

Representative transfer and output plots, respectively, are shown for N,N'-di-n-octyl-2,3:6,7-anthracenedicarboximide (FIGS. 7A and 7B), N,N'-dibenzyl-2,3:6,7-anthracenedicarboximide (FIGS. 8A and 8B), and N,N'-dicyclohexyl-2,3:6,7-anthracenedicarboximide (FIGS. 9A and 9B). Representative transfer plots in a vacuum and in air, respectively, are shown for N,N'-di-n-octyl-9,10-dicyano-2,3:6,7-anthracenedicarboximide (ADI8-CN$_2$) (FIGS. 10a and 10b).

To allow comparison with other organic FETs, mobilities (μ) were calculated by standard field effect transistor equations. In traditional metal-insulator-semiconductor FETs (MISFETs), there is typically a linear and saturated regime in the I$_{DS}$ vs V$_{DS}$ curves at different V$_G$ (where I$_{DS}$ is the source-drain saturation current; V$_{DS}$ is the potential between the source and drain, and V$_G$ is the gate voltage). At large V$_{DS}$, the current saturates and is given by:

$$(I_{DS})_{sat} = (WC_i/2L)\mu(V_G-V_t)^2 \qquad (1)$$

where L and W are the device channel length and width, respectively, C$_i$ is the capacitance of the oxide insulator (1×10$^{-8}$ F/cm$^2$ for 300 nm SiO$_2$), and V$_t$ is the threshold voltage.

Mobilities (μ) were calculated in the saturation regime by rearranging equation 1:

$$\mu_{sat} = (2I_{DS}L)/[WC_i(V_G-V_t)^2] \qquad (2)$$

where C$_i$, in this case, was 6×10$^{-8}$ F. The threshold voltage (V$_t$) can be estimated as the x intercept of the linear section of the plot of V$_G$ versus (I$_{DS}$)$^{1/2}$ (at V$_{SD}$=−100 V).

From these measurements, n-type mobilities of 0.1-0.001 cm$^2$/Vs, current on/off ratios of 10$^7$-10$^5$, and V$_t$ of 40-80 V were obtained for N,N'-dibenzyl-2,3:6,7-anthracenedicarboximide, N,N'-dicyclohexyl-2,3:6,7-anthracenedicarboximide, N,N'-di-n-octyl-2,3:6,7-anthracenedicarboximide, and N,N'-dipentafluorophenyl-2,3:6,7-anthracenedicarboximide.

Table 1 summarizes electrochemical data as well as electron mobilities, current on:off ratios (I$_{on}$:I$_{off}$), threshold voltages, and subthreshold swings for representative compounds of the present teachings.

TABLE 1

Electrochemical$^a$ and OFET$^b$ Data for ADI Derivatives.

| Compound | E$_{(red 1)}$ (V) | μ (cm$^2$/Vs) | I$_{on}$:I$_{off}$ | V$_{th}$ (V) | S (V/dec) |
|---|---|---|---|---|---|
| ADI8 | −1.17 | 0.02 (vac) | 4 × 10$^7$ | +45 | 2.0 |
| ADICy | −1.17 | 0.01 (vac) | 5 × 10$^6$ | +35 | 2.9 |
| ADI1Ph | −1.12 | 0.01 (vac) | 2 × 10$^7$ | +45 | 4.1 |
| ADICitr | −1.14 | 0.01 (vac) | 1 × 10$^6$ | +39 | 3.8 |
| ADI8-CN$_2$ | −0.33 | 0.03 (vac.) | 6 × 10$^6$ | +10 | 1.9 |
|  |  | 0.02 (air) | 2 × 10$^7$ | +15 | 1.9 |
| ADIF-CN$_2$ | −0.21 | 0.06 (vac) | 1 × 10$^6$ | +12 | 2.1 |
|  |  | 0.01 (air) | 1 × 10$^6$ | +10 | 2.3 |

$^a$In CH$_2$Cl$_2$ (vs SCE) solution (0.1 M Bu$_4$NPF$_6$ electrolyte), Pt electrode. Scan rate: 100 mV/s. Fc/Fc$^+$ (0.52 V vs. SCE) internal reference.
$^b$Film growth temperature is 90° C. on Si—SiO$_2$ substrates.

The present teachings encompass embodiments in other specific forms without departing from the spirit or essential characteristics thereof. The foregoing embodiments are therefore to be considered in all respects illustrative rather than limiting on the present teachings described herein. Scope of the present teachings is thus indicated by the appended claims rather than by the foregoing description, and all changes that come within the meaning and range of equivalency of the claims are intended to be embraced therein.

What is claimed is:

1. A field effect transistor device comprising a thin film semiconductor comprising a compound having the formula:

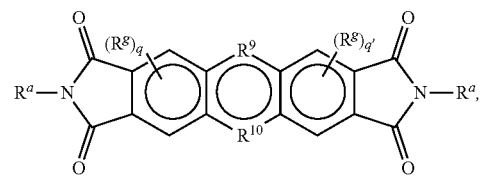

wherein:
R$^a$ is a straight chain C$_{1-10}$ alkyl group, a branched chain C$_{1-10}$ alkyl group, a straight chain C$_{1-10}$ haloalkyl group, a branched chain C$_{1-10}$ haloalkyl group, a straight chain C$_{2-10}$ alkenyl group, a branched chain C$_{2-10}$ alkenyl group, a C$_{3-10}$ cycloalkyl group, a C$_{6-14}$ aryl group, or a —$C_{1-6}$ alkyl-$C_{6-14}$ aryl group, wherein the $C_{6-14}$ aryl group is optionally substituted with 1-5 halogen groups;

$R^9$ and $R^{10}$ independently are CH or $CR^g$;

$R^g$, at each occurrence, independently is Br, F, CN, or $CF_3$;

q and q' independently are 0, 1, or 2; provided that the total number of $R^g$ groups is 1 to 6; and wherein the field effect transistor device exhibits an on/off ratio of at least about $10^5$, and a field effect electron mobility greater than about 0.001 cm$^2$/Vs.

2. The device of claim 1, wherein $R^g$ is CN.

3. The device of claim 1, wherein $R^9$ and $R^{10}$ are C(CN), and q and q' are 0.

4. The device of claim 3, wherein $R^a$ is a straight chain $C_{1-10}$ alkyl group or a branched chain $C_{1-10}$ alkyl group.

5. The device of claim 3, wherein $R^a$ is a straight chain $C_{2-10}$ alkenyl group or a branched chain $C_{2-10}$ alkenyl group.

6. The device of claim 3, wherein $R^a$ is a $C_{1-10}$ haloalkyl group or a phenyl group substituted with 1-5 halogen groups.

7. The device of claim 1 comprising a thin film semiconductor comprising a compound selected from:

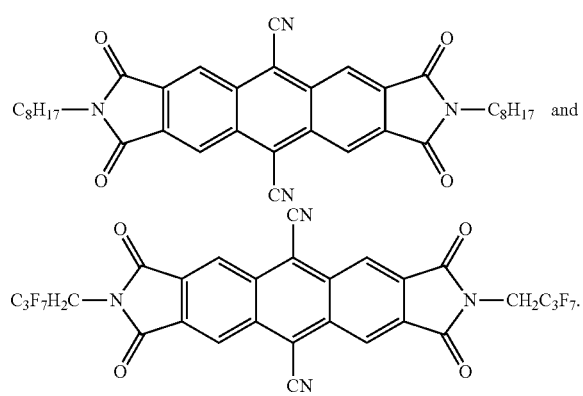

8. A field effect transistor device comprising a thin film semiconductor comprising a compound having the formula:

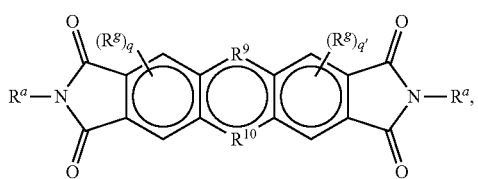

wherein:

$R^a$ is a branched chain $C_{1-10}$ alkyl group, a branched chain $C_{1-10}$ haloalkyl group, or a branched chain $C_{2-10}$ alkenyl group;

$R^9$ and $R^{10}$ independently are CH or $CR^9$;

$R^9$, at each occurrence, independently is Br, F, CN, or $CF_3$;

q and q' independently are 0, 1, or 2; provided that the total number of $R^g$ groups is less than or equal to 6; and wherein the field effect transistor device exhibits an on/off ratio of at least about $10^5$ and a field effect electron mobility greater than about 0.001 cm$^2$/Vs.

9. A field effect transistor device comprising a thin film semiconductor comprising a compound having the formula:

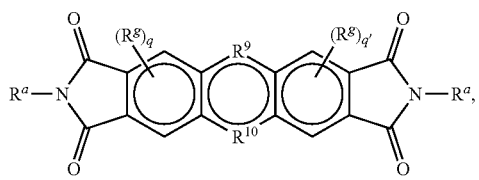

wherein:

$R^a$ is a $C_{3-10}$ cycloalkyl group, a $C_{6-14}$ aryl group, or a —$C_{1-6}$ alkyl-$C_{6-14}$ aryl group; wherein the $C_{6-14}$ aryl group is optionally substituted with 1-5 halogen groups;

$R^9$ and $R^{10}$ independently are CH or $CR^g$;

$R^g$, at each occurrence, independently is Br, F, CN, or $CF_3$;

q and q' independently are 0, 1, or 2; provided that the total number of $R^g$ groups is less than or equal to 6; and wherein the field effect transistor device exhibits an on/off ratio of at least about $10^5$ and a field effect electron mobility greater than about 0.001 cm$^2$/Vs.

10. The device of claim 9, wherein each $R^a$ is a perfluorophenyl group.

* * * * *

UNITED STATES PATENT AND TRADEMARK OFFICE
CERTIFICATE OF CORRECTION

| | | |
|---|---|---|
| PATENT NO. | : 7,892,454 B2 | Page 1 of 1 |
| APPLICATION NO. | : 11/986017 | |
| DATED | : February 22, 2011 | |
| INVENTOR(S) | : Facchetti et al. | |

It is certified that error appears in the above-identified patent and that said Letters Patent is hereby corrected as shown below:

At column 1, line 16-20, please delete the paragraph under the heading "STATEMENT REGARDING FEDERALLY SPONSORED RESEARCH OR DEVELOPMENT," and replace it with the following paragraph:

--This invention was made with government support under grant number N00014-02-1-0909 awarded by the Office of Naval Research, grant number DMR0076097 awarded by the National Science Foundation, and grant number NCC-2-1363 awarded by the National Aeronautics and Space Administration. The government has certain rights in the invention.--

Signed and Sealed this
Fifth Day of July, 2011

David J. Kappos
*Director of the United States Patent and Trademark Office*